US012713933B2

(12) United States Patent
Chen et al.

(10) Patent No.: US 12,713,933 B2
(45) Date of Patent: Aug. 18, 2026

(54) ENERGY HARVEST AND STORAGE DEVICE FOR SEMICONDUCTOR CHIPS AND METHODS FOR FORMING THE SAME

(71) Applicant: Taiwan Semiconductor Manufacturing Company Limited, Hsinchu (TW)

(72) Inventors: Kuen-Yi Chen, Hsinchu City (TW); Yi Ching Ong, Hsinchu (TW); Kuo-Ching Huang, Hsinchu City (TW); Harry-Hak-Lay Chuang, Zhubei City (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 58 days.

(21) Appl. No.: 18/779,007

(22) Filed: Jul. 21, 2024

(65) Prior Publication Data

US 2024/0371798 A1 Nov. 7, 2024

Related U.S. Application Data

(62) Division of application No. 17/735,590, filed on May 3, 2022, now Pat. No. 12,469,803.

(51) Int. Cl.

| | |
|---|---|
| ***H10W 42/00*** | (2026.01) |
| ***H01M 10/052*** | (2010.01) |
| ***H10N 15/10*** | (2023.01) |
| ***H10W 44/00*** | (2026.01) |

(52) U.S. Cl.
CPC .......... *H10W 44/601* (2026.01); *H10N 15/10* (2023.02); *H10W 42/00* (2026.01)

(58) Field of Classification Search
CPC ........ H10D 1/692; H10D 1/684; H10D 86/60; H10D 84/08; H10N 15/10; H10W 42/00; H10W 44/601; H01M 10/0525; H01M 10/052; H01M 10/056; H01M 10/058
See application file for complete search history.

(56) References Cited

U.S. PATENT DOCUMENTS 6,117,585 A * 9/2000 Anani ............... H01M 10/4264 429/7
2007/0183191 A1* 8/2007 Kim .................... G11C 11/4099 365/49.17
2008/0149738 A1* 6/2008 Fujita ........................ H03F 1/56 235/492
2012/0219831 A1* 8/2012 Mak ...................... H01M 12/04 977/734

(Continued)

*Primary Examiner* — Omar F Mojaddedi
(74) *Attorney, Agent, or Firm* — The Marbury Law Group, PLLC

(57) ABSTRACT

A semiconductor structure may be located over a substrate, and may include a parallel connection of a first component and a second component. The first component includes a series connection of a diode and a capacitor that is selected from a metal-ferroelectric-metal capacitor and a metal-antiferroelectric-metal capacitor. The second component includes a battery structure. The semiconductor structure may be used as a combination of an energy harvesting device and an energy storage structure that utilizes heat from adjacent semiconductor devices or from other heat sources.

20 Claims, 20 Drawing Sheets

(56) References Cited

U.S. PATENT DOCUMENTS

| | | | | |
|---|---|---|---|---|
| 2012/0294056 | A1* | 11/2012 | Temesi | H03K 17/08128 363/131 |
| 2017/0093394 | A1* | 3/2017 | Kurokawa | H10D 84/08 |
| 2021/0375988 | A1* | 12/2021 | Ko | H10N 50/01 |
| 2023/0198058 | A1* | 6/2023 | Strong | H01M 10/0525 429/7 |

* cited by examiner

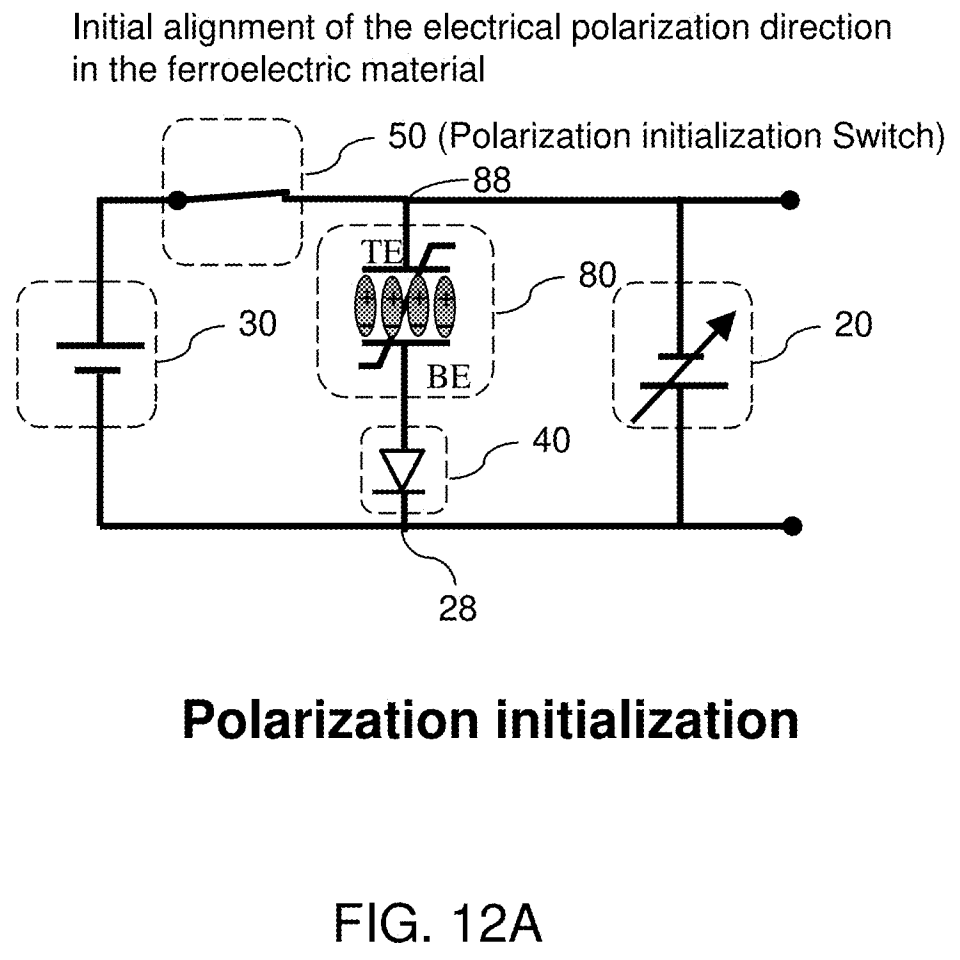

Initial alignment of the electrical polarization direction in the ferroelectric material 50 (Polarization initialization Switch)

88

80

20

TE

BE

40

28

30

Polarization initialization

FIG. 12A

ENERGY HARVEST AND STORAGE DEVICE FOR SEMICONDUCTOR CHIPS AND METHODS FOR FORMING THE SAME

RELATED APPLICATIONS

This application is a divisional application of U.S. application Ser. No. 17/735,590 entitled "Energy Harvest and Storage Device for Semiconductor Chips and Methods for Forming the Same," filed on May 3, 2022, the entire contents of which are incorporated herein by reference for all purposes.

BACKGROUND

Operation of semiconductor devices in semiconductor dies generates a significant amount of heat, which is not used for any productive purposes and thus, is wasted. As semiconductor devices scale down in semiconductor dies, the power consumption in the semiconductor dies increases, and accordingly, the amount of wasted heat increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A is a circuit diagram during pre-conditioning of the device of the present disclosure according to an embodiment of the present disclosure.

DETAILED DESCRIPTION

Figure 1:
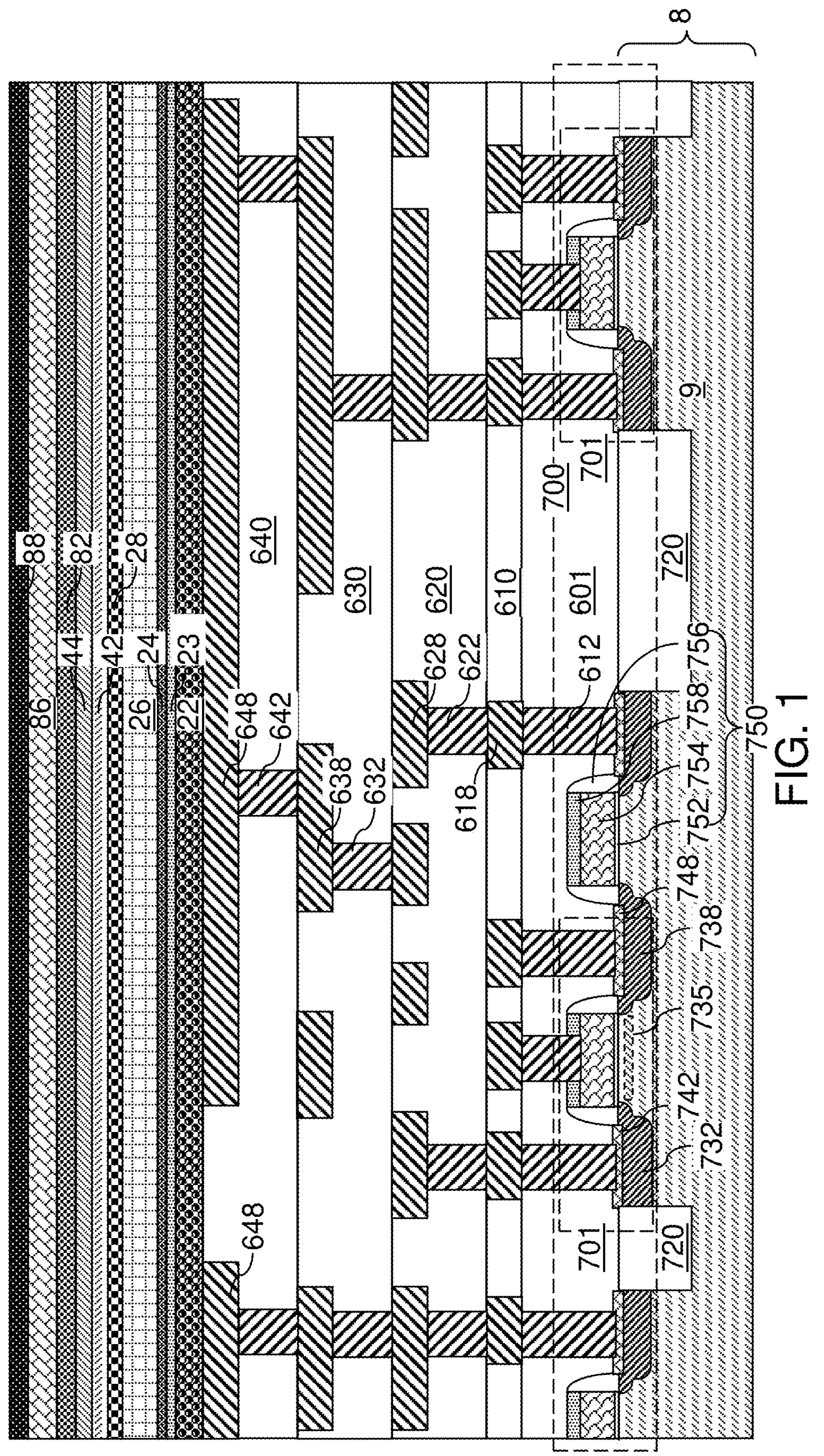
FIG. 1 is a vertical cross-sectional view of a first exemplary structure after formation of complementary metal-oxide-semiconductor (CMOS) transistors, metal interconnect structures, dielectric material layers, and a layer stack for formation of a battery structure and an energy harvesting device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Various embodiments disclosed herein may be directed to energy harvesting devices with energy storage capability. Various embodiments of the energy harvesting devices may refer to devices that receive energy from the ambient in the form of infrared radiation and convert the received energy into electricity. In one embodiment, the infrared radiation may be generated during operation of semiconductor devices on a substrate, and the energy harvesting devices of various embodiments may be formed over the same substrate, for example, in a same semiconductor die, or on a different substrate such as in a semiconductor die that is proximal to another semiconductor die including the source of thermal radiation. In some embodiments, the thermal radiation from semiconductor devices may be generated during switching of transistors, and/or while transistors are turned on. In some embodiments, the energy harvesting devices may be formed as back-end-of-line (BEOL) structures over a first subset of metal interconnect structures in a semiconductor die, and a second subset of the metal interconnect structures in the semiconductor die may be used to provide electrical connection between the energy harvesting device and semiconductor devices within the same semiconductor die, or to another structure bonded to the semiconductor die. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices may be formed on a substrate 8, and metal interconnect structures (612, 618, 622, 628, 631, 638, 642, 648) and dielectric material layers (601, 610, 620, 630, 640) over the semiconductor devices. The metal interconnect structures (612, 618, 622, 628, 631, 638, 642, 648) may be formed in the dielectric material layers (601, 610, 620, 630, 640), and may be electrically connected to the semiconductor devices.

According to an aspect of the present disclosure, a subset of the metal interconnect structures located at the topmost interconnect level may be configured to contact an electrode of a device to be subsequently formed. For example, a subset of the metal interconnect structures located at the topmost interconnect level may be configured to contact an electrode of a battery structure to be subsequently formed or to contact an electrode of an energy harvesting device to be subsequently formed.

A layer stack for formation of a battery structure, a diode, and an energy harvesting device may the subsequently formed over the dielectric material layers (601, 610, 620, 630, 640). For example, the layer stack may include, from bottom to top or from top to bottom, a first electrode material layer 22, an optional conductive metal oxide layer 23, a blocking dielectric layer 24, an energy storage medium layer 26, a second battery electrode layer 28, a diode layer stack (42, 44) including a p-n junction or a p-i-n junction, a first capacitor electrode layer 82, a node dielectric layer 86, and a second capacitor electrode layer 88.

In one embodiment, the first battery electrode layer 22 may be formed on one of the metal interconnect structures such as on a top surface of a fourth metal line structure 648. In some embodiments, the first battery electrode layer 22 may comprise the fourth metal line structure 648. In other words, the fourth metal line structure 648 may be configured to operate as the first battery electrode layer 22. In this embodiment, deposition of a metal layer as a separate first electrode material layer is optional. In embodiments in which the first battery electrode layer 22 is present, the first battery may comprise, and/or consist essentially of, a conductive material such as an elemental metal, an intermetallic alloy, a conductive metal nitride (such as TiN, TaN, WN, or MoN), a conductive oxide material (such as indium tin oxide, indium zinc oxide, or aluminum zinc oxide), a conductive polymer material, graphene, carbon nanotubes, or other conductive materials that may effective function as a conductive barrier material for the energy storage medium layer 26. The thickness of the first battery electrode layer 22 may be in a range from 5 nm to 100 nm, although lesser and greater thicknesses may also be used.

In embodiments in which the conductive metal oxide layer 23 is present, the conductive metal oxide layer 23 may comprise, and/or consist essentially of, a thin layer of conductive transition metal oxide such as ruthenium oxide. In such embodiments, the thickness of the conductive metal oxide layer 23 may be in a range from 0.3 nm to 2.0 nm, such as from 0.6 nm to 1.2 nm, although lesser and greater thicknesses may also be used. In one embodiment, the conductive metal oxide layer 23 may comprise an interfacial oxide layer that may be formed by oxidation of a surface portion of the second battery electrode layer 28 upon contact with the blocking dielectric layer 24.

The blocking dielectric layer 24 comprises, and/or consists essentially of, a dielectric metal oxide material. Non-limiting examples of the dielectric metal oxide material comprise aluminum oxide, hafnium oxide, zirconium oxide, titanium oxide, tantalum oxide, manganese oxide, lanthanum oxide, yttrium oxide, etc. Other suitable dielectric metal oxide materials may be used within the contemplated scope of disclosure. The thickness of the blocking dielectric layer 24 may be selected such that electrons may tunnel through the blocking dielectric layer 24 while ions are blocked by the blocking dielectric layer 24. For example, the thickness of the blocking dielectric layer 24 may be in a range from 1 nm to 2 nm, although lesser and greater thicknesses may also be used.

The energy storage medium layer 26 may comprise, and/or consist essentially of, an ionic crystal plate including an ionic crystal. The ionic crystal may have ionic conductivity greater than $1.0\times10^{-5}$ S/cm in a temperature range from −40 degrees Celsius to 125 degrees Celsius. Non-limiting examples of ionic crystals comprise lithium fluoride, lithium chloride, lithium bromide, lithium iodide, potassium fluoride, potassium chloride, potassium bromide, potassium iodide, sodium fluoride, etc. Other suitable ionic crystal materials may be used within the contemplated scope of disclosure. The thickness of the energy storage medium layer 26 may be in a range from 30 nm to 1,000 nm, such as from 100 nm to 500 nm, although lesser and greater thicknesses may also be used.

The second battery electrode layer 28 may comprise, and/or consist essentially of, a metallic material including at least one transition metal or a conductive metal oxide material. For example, the second battery electrode layer 28 may comprise, and/or may consist essentially of, Ti, Ta, W, Ru, Rh, Co, Mo, Nb, Pd, Pt, Re, Os, or Ir. Alternatively, the second battery electrode layer 28 may comprise, and/or may consist essentially of, a conductive metal oxide material such as indium tin oxide, indium zinc oxide, or aluminum zinc oxide. The second battery electrode layer 28 may be configured to function as a first battery electrode of the battery structure 20 as well as a second diode electrode of the energy harvesting device 80. The thickness of the second battery electrode layer 28 may be in a range from 10 nm to 100 nm, although lesser and greater thicknesses may also be used.

The diode layer stack (42, 44) includes, from bottom to top or from top to bottom, an n-doped semiconductor material layer 42 and a p-doped semiconductor material layer 44. Optionally, an intrinsic semiconductor material layer (not shown) may be formed between the n-doped semiconductor material layer 42 and the p-doped semiconductor material layer 44. In embodiments in which an intrinsic semiconductor material layer is not present, a p-n junction layer may be formed. In embodiments in which an intrinsic semiconductor material layer is present, a p-i-n junction structure may be formed. Various embodiments are described in which the n-doped semiconductor material layer 42 underlies the p-doped semiconductor material layer 44, embodiments are expressly contemplated herein in which the p-doped semiconductor material layer 44 underlies the n-doped semiconductor material layer 42.

The n-doped semiconductor material layer 42 includes an n-doped semiconductor material. The n-doped a semiconductor material may comprise silicon, germanium, a silicon-germanium alloy, or a germanium-tin alloy, and is doped with n-type dopants such as phosphorus, arsenic, and/or antimony. The thickness of the n-doped a semiconductor material layer 42 may be in a range from 10 nm to 100 nm, although lesser and greater thicknesses may also be used.

The p-doped semiconductor material layer 44 may include a p-doped semiconductor material. The p-doped a semiconductor material may comprise silicon, germanium, a silicon-germanium alloy, or a germanium-tin alloy, and is doped with p-type dopants such as boron and/or indium. The thickness of the p-doped a semiconductor material layer 44 may be in a range from 10 nm to 100 nm, although lesser and greater thicknesses may also be used.

The first capacitor electrode layer 82 comprises, and/or consists essentially of, a conductive material such as an elemental metal, an intermetallic alloy, a conductive metal nitride (such as TiN, TaN, WN, or MoN), a conductive oxide material (such as indium tin oxide, indium zinc oxide, or aluminum zinc oxide), a conductive polymer material, graphene, carbon nanotubes, or other conductive materials. The thickness of the first capacitor electrode layer 82 may be in a range from 5 nm to 100 nm, although lesser and greater thicknesses may also be used.

The node dielectric layer 86 comprises, and/or consists of, a ferroelectric material layer or an antiferroelectric material layer. In one embodiment, the node dielectric layer 86 may be a ferroelectric material layer including a ferroelectric perovskite material, a ferroelectric rutile material, or another ferroelectric material having an orthorhombic crystalline structure. Non-limiting examples of ferroelectric dielectric materials that may be used for the node dielectric layer 86 comprise barium titanate ($BaTiO_3$), lead titanate ($PbTiO_3$), lead zirconate titanate ($PbZr_xTi_{1-x}O_3$ in which x is between 0 and 1; PZT), triglycine sulphate ($(NH_2CH_2COOH)_3 \cdot H_2SO_4$), a ferroelectric polymer material such as polyvinylidene fluoride (PVDF), lithium tantalite ($LiTaO_3$), and aluminum nitride. Other ferroelectric materials within the contemplated scope of disclosure may be used.

In one embodiment, the node dielectric layer 86 may be an antiferroelectric material layer. Non-limiting examples of antiferroelectric dielectric materials that may be used for the node dielectric layer 86 comprise lead zirconate ($PbZrO_3$; PZO) having a perovskite structure, lithium sodium niobite ($(Li_xNa_{1-x})NbO_3$), potassium sodium niobate, ($(K_xNa_{1-x})NbO_3$), zirconium-doped hafnium oxide, lanthanum-doped zirconium-rich lead lanthanum zirconate titanate ($Pb(Zr,Ti)O_3$; PLZT), and $Pb_{(1-3x/2)}La_xZr_{0.85}Ti_{0.15}O_3$ (PLZT) films with x in a range from 0.08 to 0.14. Other antiferroelectric dielectric materials within the contemplated scope of disclosure may be used. The thickness of the energy storage medium layer 86 may be in a range from 4 nm to 100 nm, such as from 8 nm to 20 nm, although lesser and greater thicknesses may also be used. The node dielectric layer 86 may be deposited by any suitable deposition method for depositing a ferroelectric material or an antiferroelectric material as known in the art such as physical vapor deposition, atomic layer deposition, etc.

The second capacitor electrode layer 88 comprises, and/or consists essentially of, a conductive material such as an elemental metal, an intermetallic alloy, a conductive metal nitride (such as TiN, TaN, WN, or MoN), a conductive oxide material (such as indium tin oxide, indium zinc oxide, or aluminum zinc oxide), a conductive polymer material, graphene, carbon nanotubes, or other conductive materials. The thickness of the second capacitor electrode layer 88 may be in a range from 5 nm to 100 nm, although lesser and greater thicknesses may also be used.

Generally, each layer within the layer stack (20, 40, 80) may be formed as a planar material layer having a respective uniform thicknesses.

Figure 2A:
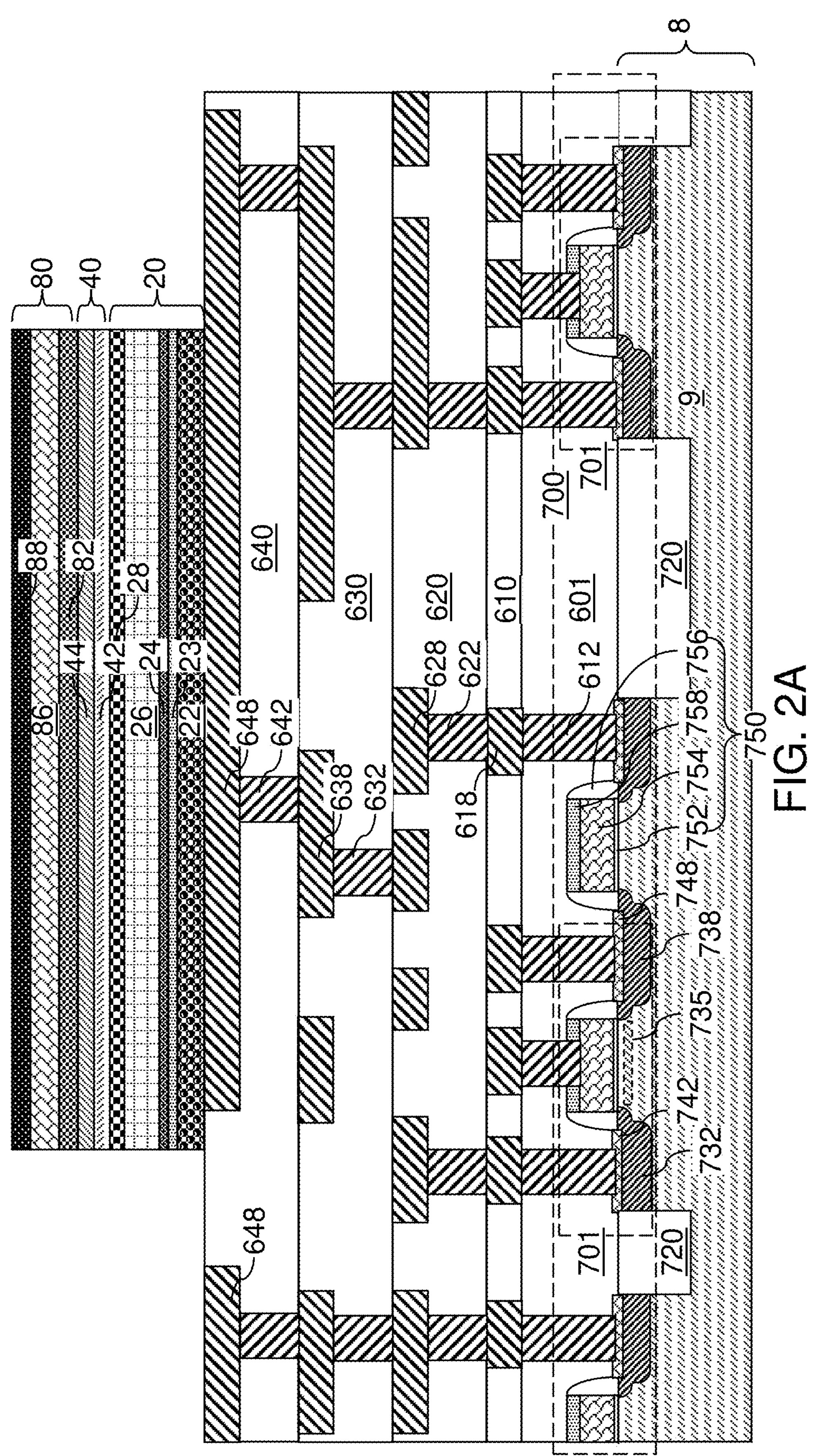
FIG. 2A is a vertical cross-sectional view of the first exemplary structure after formation of a layer stack of a battery structure and an energy harvesting device according to an embodiment of the present disclosure.
Figure 2B:
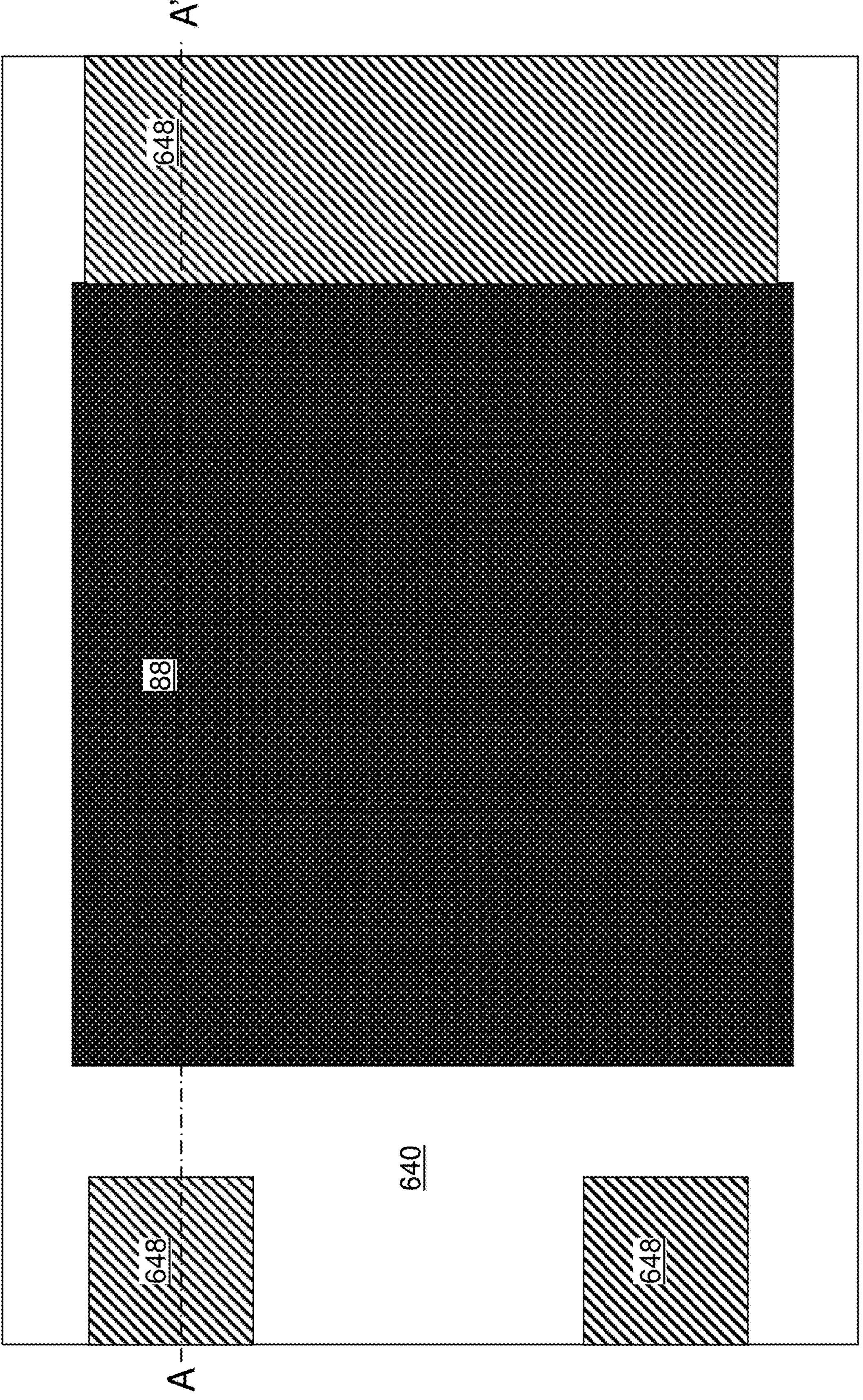
FIG. 2B is a top-down view of the first exemplary structure of FIG. 2A. The vertical plane A-A' is the plane of the vertical cross-sectional view of FIG. 2A.

Referring to FIGS. 2A and 2B, a photoresist layer (not shown) may be applied over the top surface of the layer stack of the deposited material layers (22, 23, 24, 26, 28, 42, 44, 82, 6, 88), and may be lithographically patterned to cover at least one discrete area that overlies a respective underlying metal line structure (such as a respective fourth metal line structure 648). An etch process, such as an anisotropic etch process, may be performed to etch unmasked portions of the layer stack of the deposited material layers (22, 23, 24, 26, 28, 42, 44, 82, 6, 88). The anisotropic etch process may include multiple anisotropic etch steps having different etch chemistries to etch through the various materials within the layer stack of the deposited material layers. Each patterned portion of the layer stack of the deposited material layers constitutes a vertical stack of a battery structure 20, a diode 40, and an energy harvesting device 80. The photoresist layer may be subsequently removed, for example, by ashing.

Each battery structure 20 comprises a layer stack of a first battery electrode layer 22, a conductive metal oxide layer 23, a blocking dielectric layer 24, an energy storage medium layer 26, and a second battery electrode layer 28. Each diode 40 (which is also referred to as diode layer stack) includes a p-doped semiconductor material layer 44 and an n-doped semiconductor material layer 42. Each energy harvest device 80 comprises a ferroelectric capacitor structure or an antiferroelectric capacitor structure. Each energy harvest device 80 may comprise a first capacitor electrode layer 82, a node dielectric layer 86 that comprises a ferroelectric material layer or an antiferroelectric material layer, and a second capacitor electrode layer 88. While only one stack of a battery structure 20, a diode 40, and an energy harvest device 80 is illustrated in FIGS. 2A and 2B, embodiments are expressly contemplated herein in which a plurality of stacks of a respective battery structure 20, a respective diode 40, and a respective energy harvest device 80 is formed over the dielectric material layers (601, 610, 620, 630, 640).

Generally, a layer stack including at least a first battery electrode layer 22, an energy storage medium layer 26, a second battery electrode layer 28, a diode (42, 44) layer stack including a p-n junction or a p-i-n junction therein, a first capacitor electrode layer 82, a node dielectric layer 86 that comprises a ferroelectric material layer or an antiferroelectric material layer, and a second capacitor electrode layer 88 may be formed over a substrate 8 in a forward order or in a reverse order. The layer stack may be patterned to form a stack of an energy harvesting device 80, a diode 40 over the substrate 8.

The battery structure 20 comprises an energy storage medium layer 26 that contains an ionic crystal plate including an ionic crystal having ionic conductivity greater than $1.0\times10^{-5}$ S/cm in a temperature range from −40 degrees Celsius to 125 degrees Celsius. The diode 40 comprises a p-doped semiconductor material layer 44 and an n-doped semiconductor material layer 42, and one of the p-doped semiconductor material layer 44 and the n-doped semiconductor material layer 42 is electrically connected to an electrical node of the capacitor (which functions as an energy harvest device 80), for example, by direct contact. The energy harvest device 80 comprises a capacitor that uses a ferroelectric material or an antiferroelectric material as a node dielectric material. The capacitor comprises a first capacitor electrode layer 82 comprising a first conductive material, a node dielectric layer 86 selected from a ferroelectric material layer and an antiferroelectric material layer, and a second capacitor electrode layer 88 comprising a second conductive material.

Figure 3A:
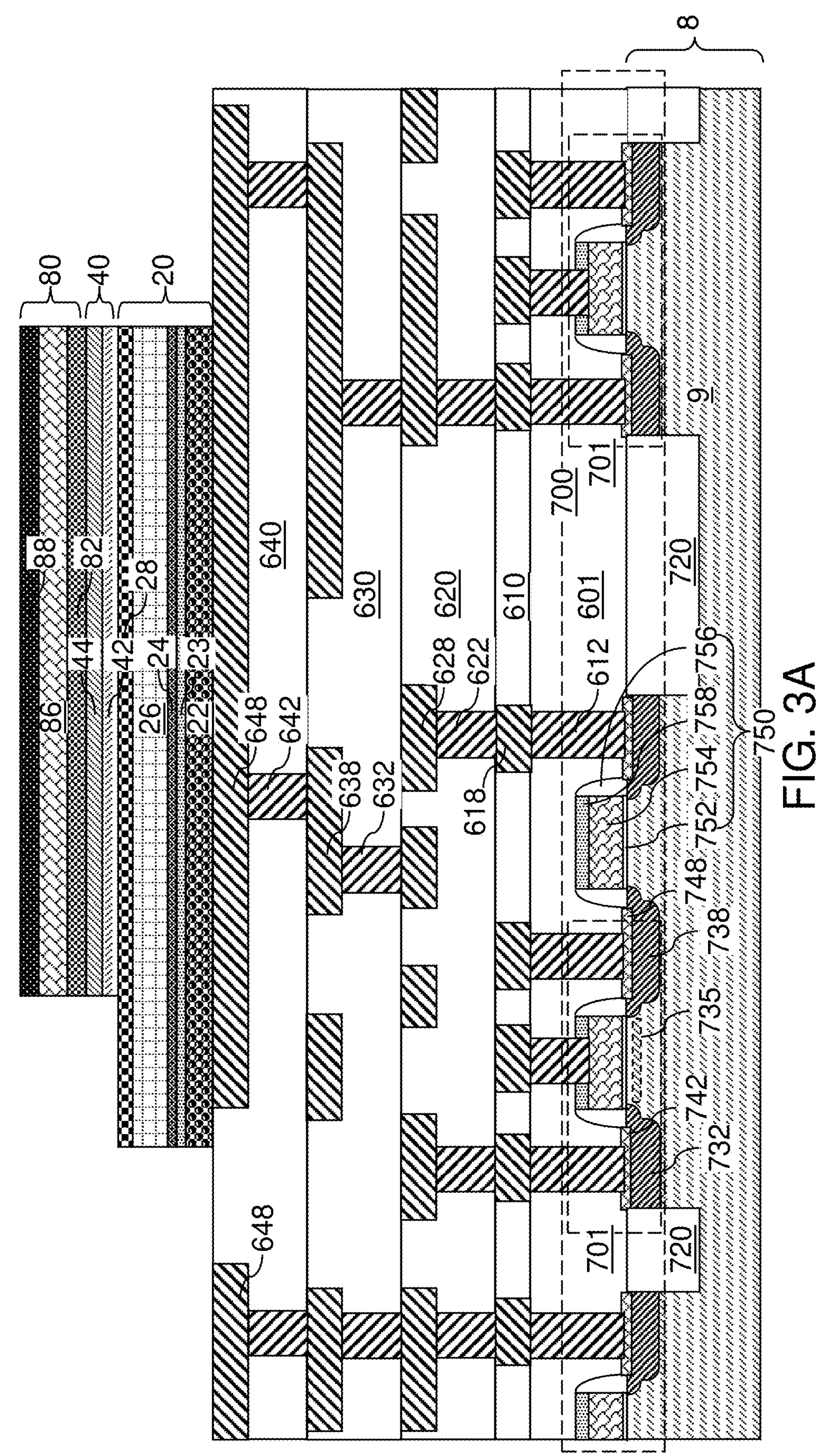
FIG. 3A is a vertical cross-sectional view of the first exemplary structure after pattering an upper portion of the layer stack to expose a top surface of a battery electrode layer according to an embodiment of the present disclosure.
Figure 3B:
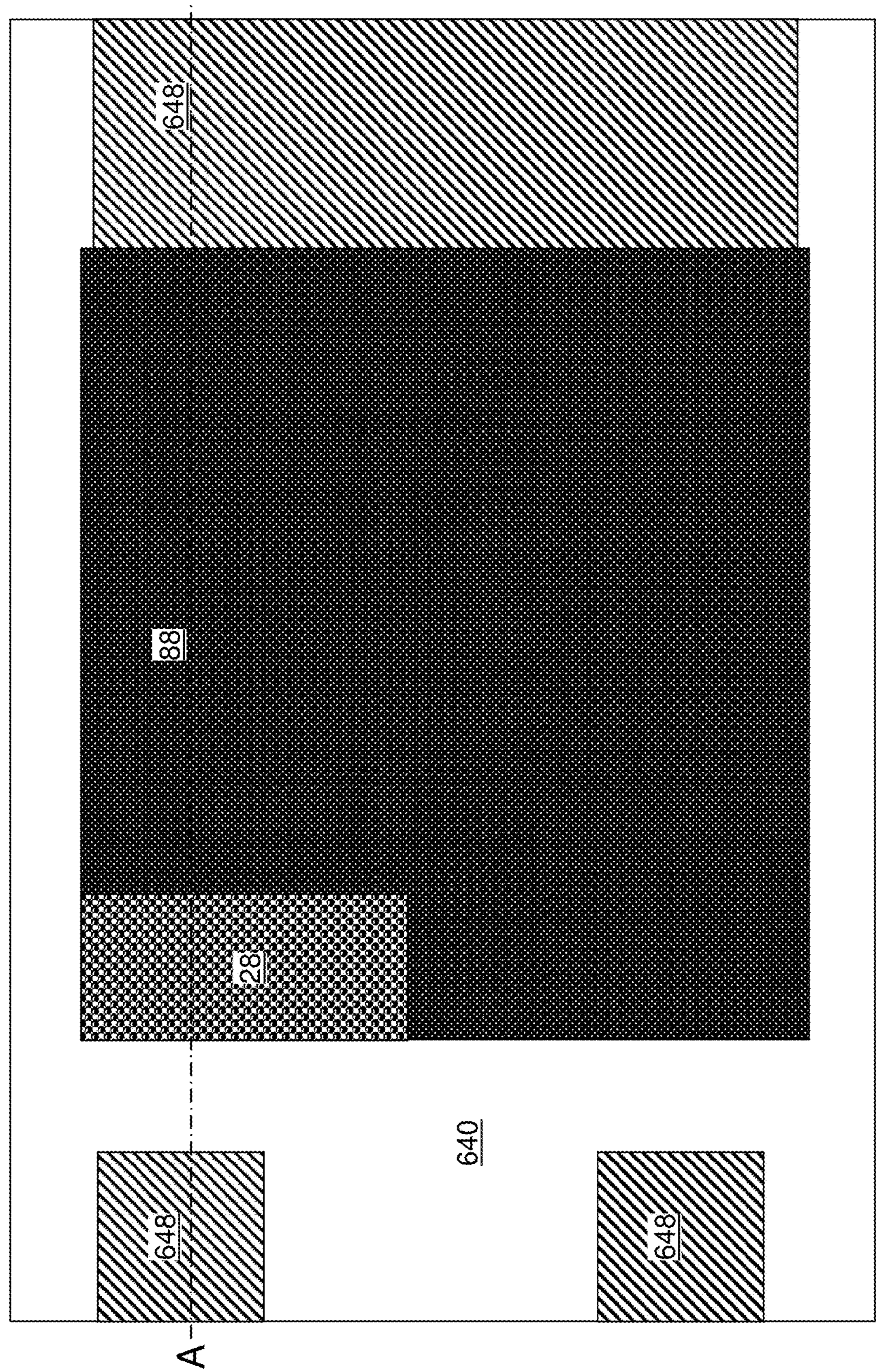
FIG. 3B is a top-down view of the first exemplary structure of FIG. 3A. The vertical plane A-A' is the plane of the vertical cross-sectional view of FIG. 3A.

Referring to FIGS. 3A and 3B, an upper portion of the layer stack (20, 40, 80) may be patterned to physically expose a top surface of an upper electrode layer (such as the second battery electrode layer 28) of the battery structure 20. For example, a photoresist layer (not shown) may be applied over the second electrode material layer 88 and physically exposed surfaces of the fourth interconnect-level dielectric material layer 640 and the fourth metal line structures 648, and may be lithographically patterned to form an opening located within the area of layer stack (20, 40, 80). The area of the opening may in a range from 0.1% to 30% of the layer stack (20, 40, 80), although lesser and greater percentages may also be used.

An anisotropic etch process may be performed to remove portions of the layer stack (20, 40, 80) located above the second battery electrode layer 28. In embodiments in which the energy harvest device 80 and the diode 40 overlie the battery structure 20, the material layers of the energy harvest device 80 and the diode 40 may be etched through by performing an anisotropic etch process. The anisotropic etch process may include a plurality of anisotropic etch steps that sequentially etch that various material layers in the energy harvest device 80 and the diode 40. A top surface of a battery electrode layer in contact with the diode 40, such as the second battery electrode layer 28, may be physically exposed at the bottom of a via cavity that underlies the opening in the photoresist layer. The photoresist layer may be subsequently removed, for example, by ashing.

Generally, the layer stack (20, 40, 80) may be patterned such that material layers overlying a battery electrode layer (e.g., second battery electrode layer 28) in contact with the diode 40 have a lesser area than the battery electrode layer and underlying material layers. In one embodiment, each layer within the battery structure 20 may have a first area, and each layer in the diode 40 and the energy harvesting device 80 may have a second area that is smaller than the first area.

Figure 4A:
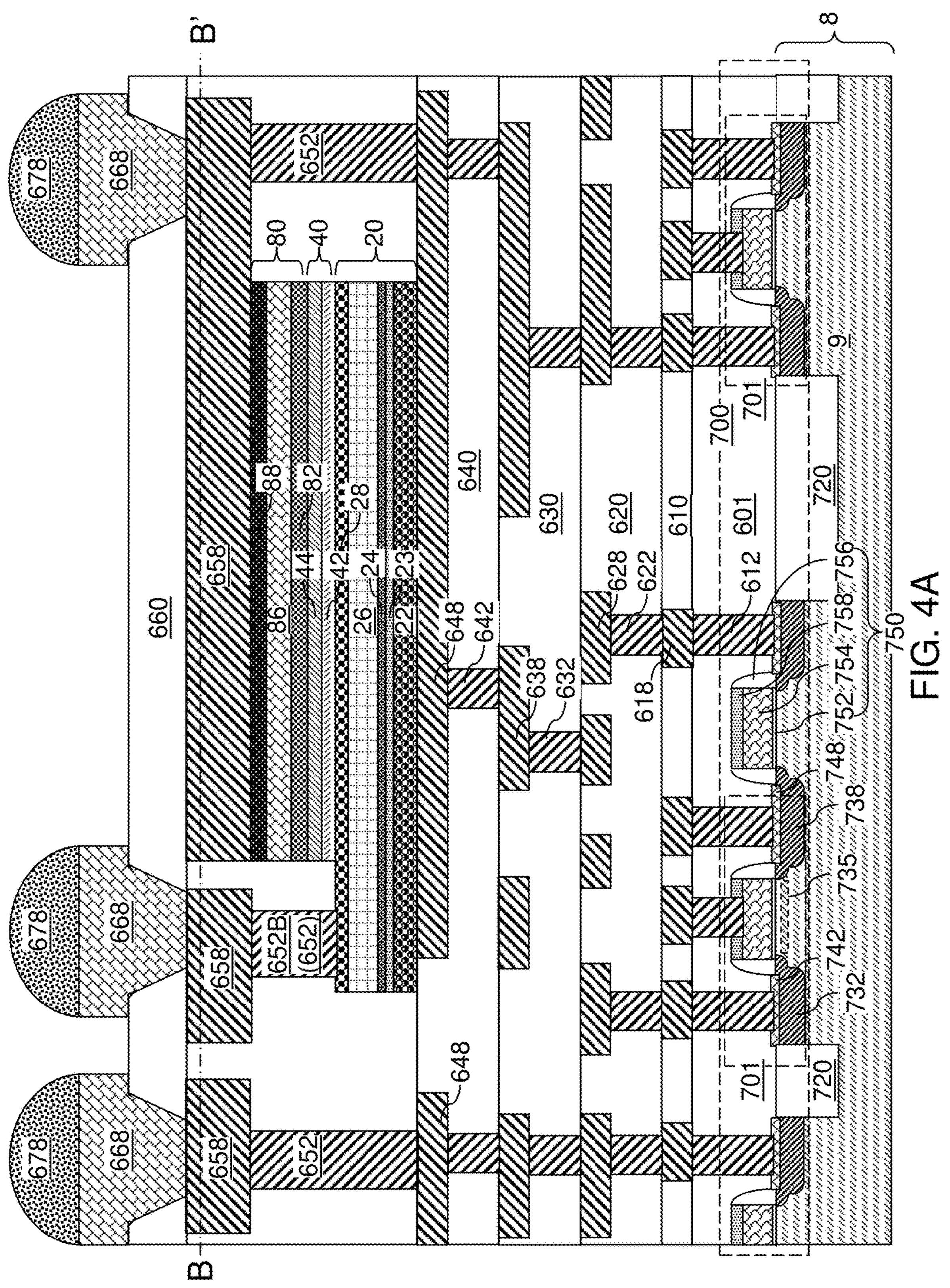
FIG. 4A is a vertical cross-sectional view of the first exemplary structure after formation of top-level interconnect structures and bonding structures according to an embodiment of the present disclosure.
Figure 4B:
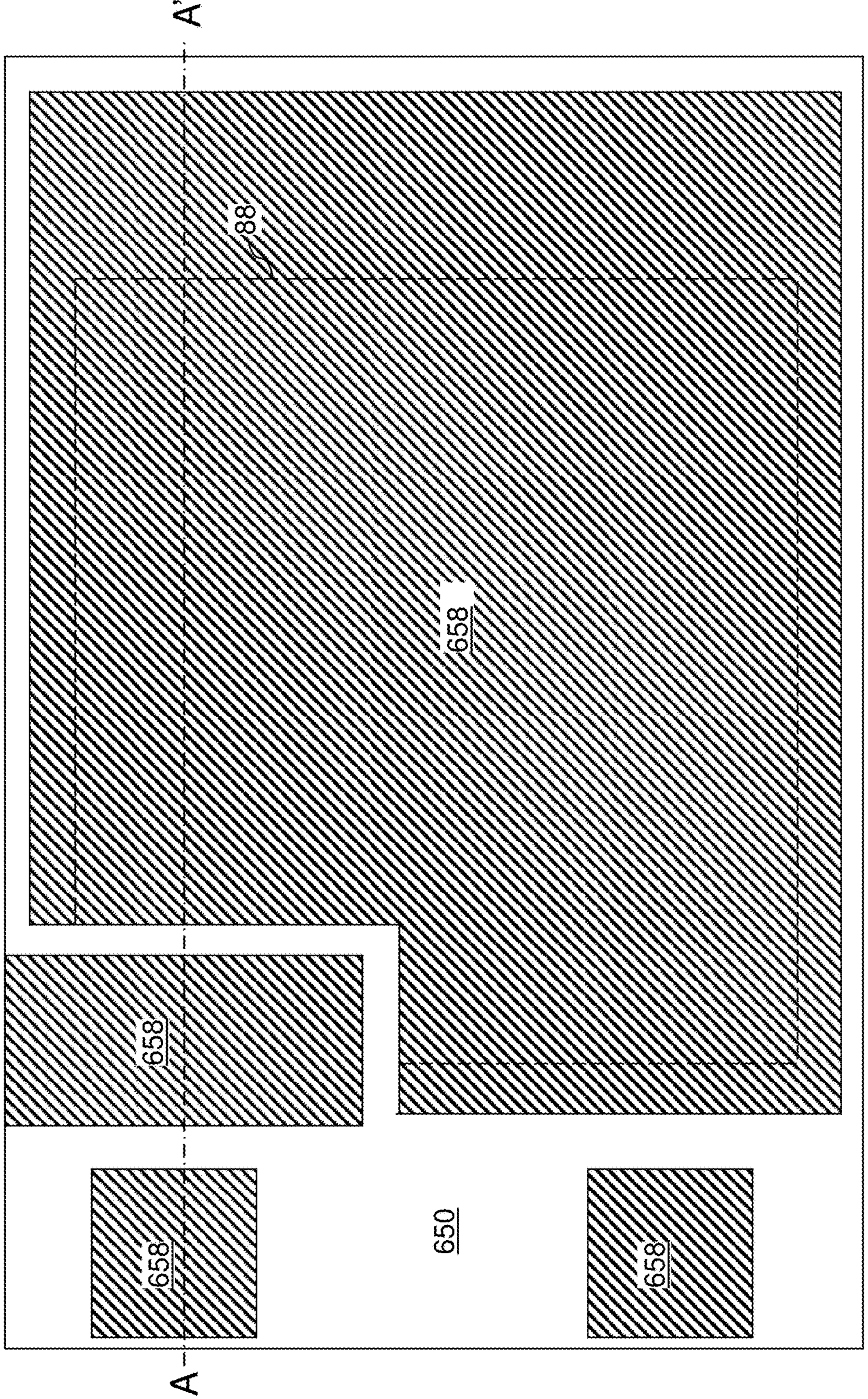
FIG. 4B is a horizontal cross-sectional view along the horizontal plane B-B' of FIG. 4A. The vertical plane A-A' is the plane of the vertical cross-sectional view of FIG. 4A.

Referring to FIGS. 4A and 4B, additional metal interconnect structures may be formed to electrically connect the second battery electrode layer 28 and the second capacitor electrode layer 88. For example, a top interconnect-level dielectric material layer 650 may be formed over the stack of the battery structure 20 and the energy harvesting device 80, and may be planarized to provide a planar top surface. Top-level interconnect structures (652, 658) may be formed in the top interconnect-level dielectric material layer 650. The top-level interconnect structures (652, 658) may comprise top-level metal via structures 652 and top-level metal line structures 658. One of the top-level metal via structures 652 may be formed directly on a top surface of the second battery electrode layer 28. This top-level metal via structure 652 is herein referred to as a battery electrode contact via structure 652B. The battery electrode contact via structure 652B provides electrical contact to the second battery electrode layer 28. One of the top-level metal line structures 658 may contact a portion or an entirety of the top surface of the second capacitor electrode layer 88.

According to an aspect of the present disclosure, the top-level interconnect structures (652, 658) may be configured to provide electrical connection between the first battery electrode layer 22 and the second capacitor electrode layer 88. For example, a combination of a fourth metal line structure 648, a top-level metal via structure 652, and a top-level metal line structure 658 may provide electrical connection between the first battery electrode layer 22 and the second capacitor electrode layer 88.

Figure 4C:
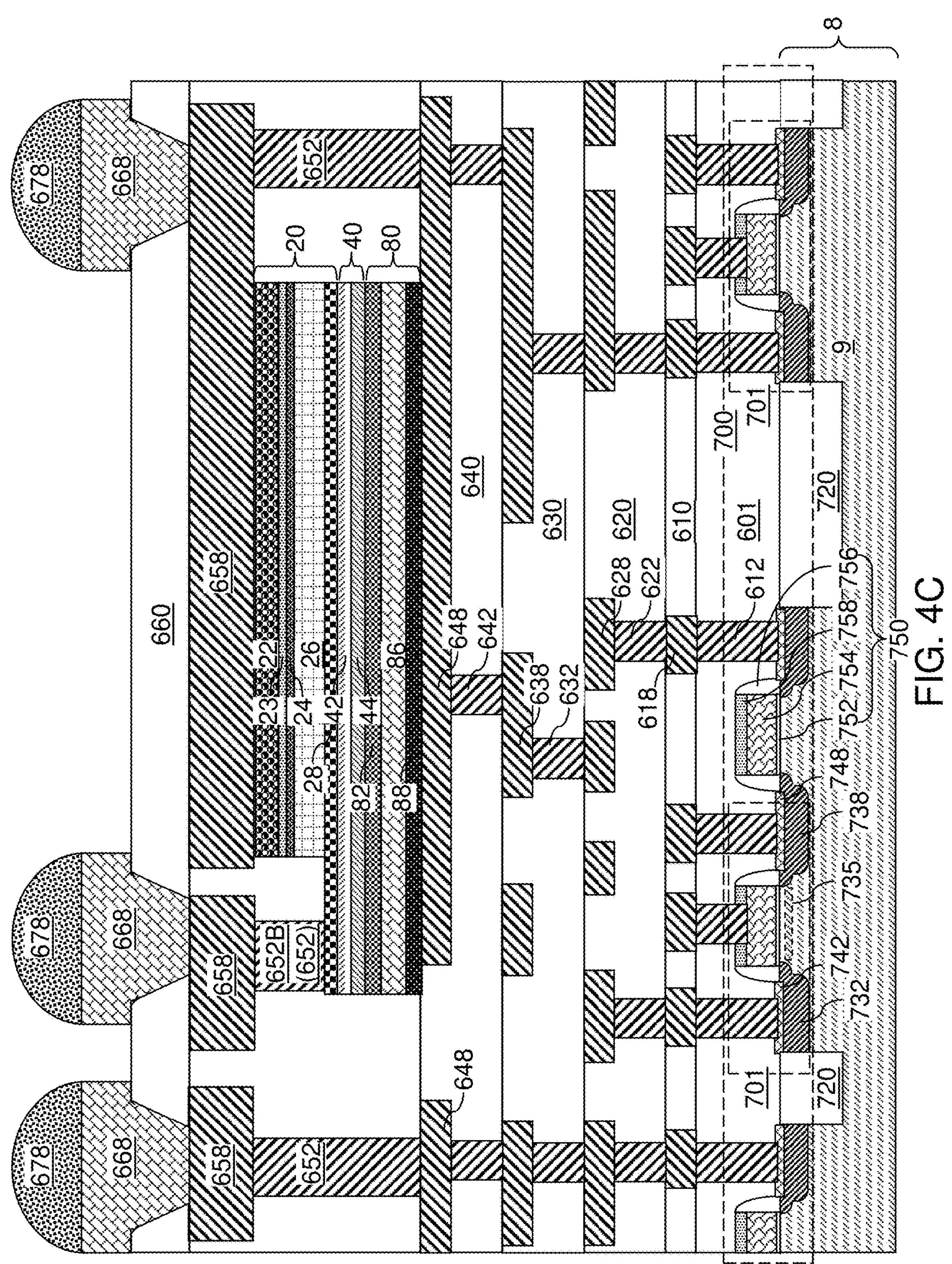
FIG. 4C is a vertical cross-sectional view of an alternative configuration of the first exemplary structure according to an embodiment of the present disclosure.

Referring to FIG. 4C, an alternative configuration of the first exemplary structure is illustrated. The alternative configuration of the first exemplary structure may be derived from the first exemplary structure by reversing the order of layer stack (20, 40, 80). In this embodiments, the energy harvesting device 80 and the diode 40 may have a first area, and the battery structure 20 may have a second area that is less than the first area. A battery electrode contact via structure 652B may be in contact with a top surface of a battery electrode (such as the second battery electrode 28) of the battery structure 20.

Referring collectively to FIGS. 4A-4C, additional metal interconnect structures (652, 658) may be formed on the second battery electrode layer 28 and on one of the first capacitor electrode layer 82 and the second battery electrode layer 28. The first battery electrode layer 22 and the second capacitor electrode layer 88 may be electrically connected by forming least one metal interconnect structure (652, 658) that provides an electrically conductive path between the first battery electrode layer 22 and the second capacitor electrode layer 88. A battery electrode contact via structure 652B may be in contact with a top surface of the second battery electrode layer 28 of the battery structure 20.

A dielectric material layer may be subsequently formed over the layer stack (20, 40, 80). For example, a bonding-level dielectric material layer 660 (such as a passivation dielectric layer including silicon nitride or polyimide) may be formed over the top interconnect-level dielectric material layer 650. Openings may be formed through the bonding-level dielectric material layer 660 within areas of a subset of the top-level metal line structures 658 that are configured as metal contact pads. Bonding structures 668 such as under-bump metallization (UBM) lines may be formed in the openings on a respective one of the top-level metal line structures 658. The bonding structures 668 may extend through the bonding-level dielectric material layer 660. The bonding structures 668 may be electrically connected to a respective element selected from the first capacitor electrode layer 82 and the second battery electrode layer 28. A solder material portion 678 may be subsequently attached to each bonding structure 668 so that the semiconductor die may be bonded to another structure (such as an interposer).

Generally, the layer stack (20, 40, 80) in the first exemplary structure (or in alternative configurations thereof) may include, from one side to another, a first battery electrode layer 22, an energy storage medium layer 26, a second battery electrode layer 28, a diode layer stack (42, 44) including a p-n junction or a p-i-n junction therein, a first capacitor electrode layer 82, a node dielectric layer 86 selected from a ferroelectric material layer and an antiferroelectric material layer, and a second capacitor electrode layer 88.

The semiconductor structure of the first exemplary structure may be located over a substrate 8, and may comprise a parallel connection of a first connection component (40, 80) and a second connection component 20. The first connection component (40, 80) comprises a series connection of a diode 40 and a capacitor (which functions as an energy harvest device 80) that is selected from a metal-ferroelectric-metal capacitor and a metal-antiferroelectric-metal capacitor. The second connection component 20 comprises a battery structure 20.

In one embodiment, the semiconductor structure comprises at least one metal interconnect structure (612, 618, 622, 628, 632, 638, 642, 648) that provides an electrically conductive path between an electrode of the capacitor (which functions as an energy harvest device 80) and an electrode of the battery structure 20. In one embodiment, the battery structure 20 comprises a first battery electrode layer 22 that may be electrically connected to the second capacitor electrode layer 88, and a second battery electrode layer 28 that is electrically connected to an electrical node of the diode 40, such as the n-doped semiconductor material layer 42.

In one embodiment, the at least one metal interconnect structure (612, 618, 622, 628, 632, 638, 642, 648) comprises at least one metal line structure (618, 628, 638, 648) and at least one metal via structure (612, 622, 632, 642) that are located within at least one dielectric material layer (601, 610, 620, 630, 640). The layer stack (30, 40, 80) overlies the metal interconnect structures (612, 618, 622, 618, 632, 638, 642, 648) and the dielectric material layers (601, 610, 620, 630, 640). The semiconductor structure further comprises additional metal interconnect structures (648, 652, 658) in contact with a respective one of the second capacitor electrode layer 88, the second battery electrode layer 22, and the first battery electrode layer 22.

In one embodiment, the substrate 8 comprises a semiconductor substrate, and the semiconductor structure comprises field effect transistors 701 located on, or over, the semiconductor substrate. The layer stack (20, 40, 80) may be located over the semiconductor substrate. The metal interconnect structures (612, 618, 622, 618, 632, 638, 642, 648) may comprise a first subset of the metal interconnect structures (612, 618, 622, 618, 632, 638, 642, 648) that is electrically connected to the second capacitor electrode layer 88, and a second subset of the metal interconnect structures (612, 618, 622, 618, 632, 638, 642, 648) that is electrically connected to the second battery electrode layer 22.

Figure 5:
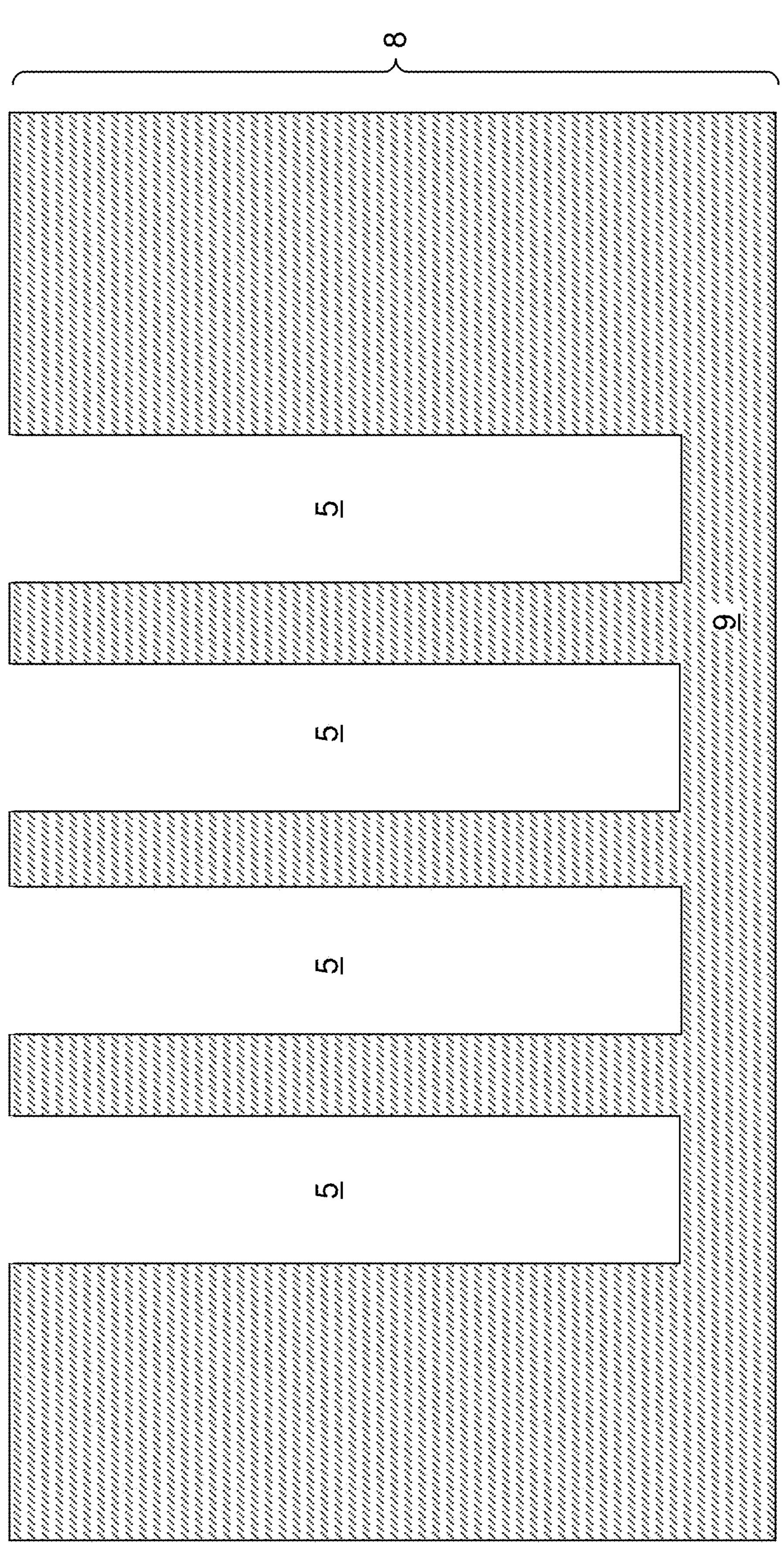
FIG. 5 is a vertical cross-sectional view of a second exemplary structure after formation of trenches in an upper portion of a substrate according to an embodiment of the present disclosure.

Referring to FIG. 5, a second exemplary structure according to an embodiment of the present disclosure may be formed by providing a substrate 8, which may be a semiconductor substrate. In one embodiment, the semiconductor substrate may be a portion of a commercially available single crystalline silicon substrate. A photoresist layer (not shown) may be applied over the top surface of the substrate 8, and may be patterned to form a pattern of at least one opening therein. The openings may be discrete, or may comprise a continuous opening including multiple sections that are adjoined to one another. An anisotropic etch process may be performed to form at least one trench 5 in an upper portion of the substrate 8. The depth of each trench 5 may be in a range from 500 nm to 10,000 nm, although lesser and greater depths may also be used. The minimum dimension between each opposing pair of sidewalls of each trench 5 is greater than the twice the total thickness of the layer stack to be subsequently formed on the sidewalls of the at least one trench 5. In an illustrative example, the minimum dimension between each opposing pair of sidewalls of each trench 5 may be greater than 200 nm. In an illustrative example, the width of each trench 5 may be in a range from 200 nm to 10,000 nm, such as from 600 nm to 5,000 nm, although lesser and greater widths may also be used.

Figure 6:
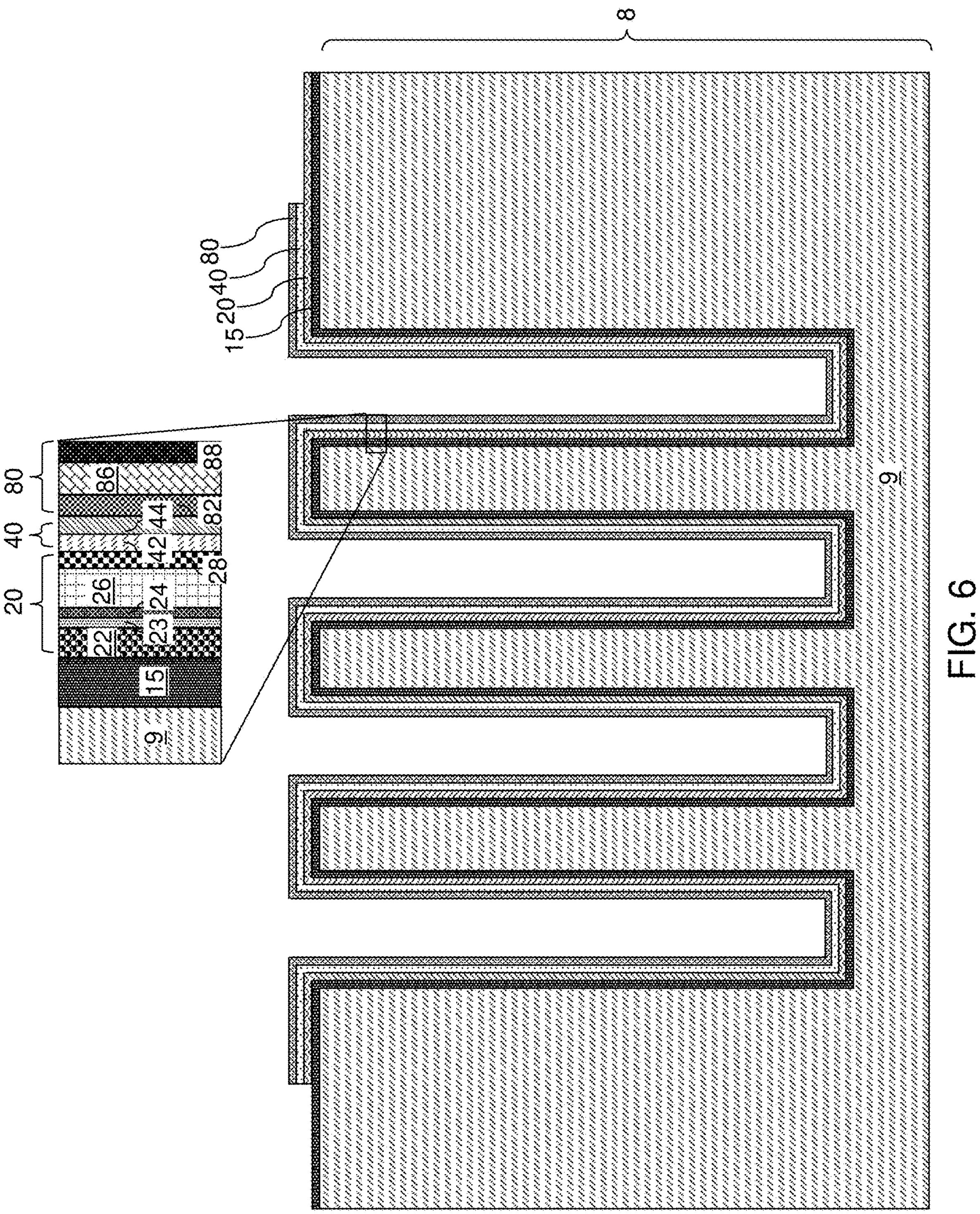
FIG. 6 is a vertical cross-sectional view of the second exemplary structure after formation of a layer stack including an energy harvesting device and a battery structure according to an embodiment of the present disclosure.

Referring to FIG. 6, an optional liner layer 15 and a layer stack (20, 40, 80) including a first electrode material layer 22, an optional conductive metal oxide layer 23, a blocking dielectric layer 24, an energy storage medium layer 26, a second battery electrode layer 28, a diode layer stack (42, 44) including a p-n junction or a p-i-n junction, a first capacitor electrode layer 82, a node dielectric layer 86, and a second capacitor electrode layer 88, in a forward or in a reverse order, may be formed in the at least one trench 5 and over the top surface of the substrate 8. In embodiments in which the optional liner layer 15 is present, the liner layer 15 may comprise a dielectric material such as silicon oxide, and provide enhanced adhesion for the layer stack and/or electrical isolation from the material of the substrate 8 in embodiments in which electrical isolation is desired. Alternatively, the optional liner layer 15 may provide enhanced adhesion for the layer stack (20, 40, 80), and electrical connection between a most proximal layer within the layer stack and the material of the substrate 8 in embodiments in which the substrate 8 is used as an electrically conductive node. Alternatively, the optional liner layer 15 may be omitted.

The layer stack ({20, 40, 80}; 22, 23, 24, 26, 28, 42, 44, 82, 86, 88) may comprise a same set of material layers as in the first exemplary structure. The deposition methods for forming each layer within the layer stack (22, 23, 24, 26, 28, 42, 44, 82, 86, 88) may be altered if necessary. Generally, a conformal deposition process is preferred over a non-conformal deposition process for deposition of each layer within the layer stack (22, 23, 24, 26, 28, 42, 44, 82, 86, 88). While the present disclosure is described using an embodiment in which a cavity is present within each trench 5 after deposition of the layer stack (22, 23, 24, 26, 28, 42, 44, 82, 86, 88), embodiments are expressly contemplated herein in which one or more trenches 5 is filled upon deposition of the last material layer within the layer stack (22, 23, 24, 26, 28, 42, 44, 82, 86, 88).

Subsequently, the layer stack (22, 23, 24, 26, 28, 42, 44, 82, 86, 88) may be suitably patterned to provide an area in which a top surface of the liner layer 15 (in embodiments in which the liner layer 15 includes a conductive material) or a top surface of the first battery electrode layer 22 is physically exposed, an area in which a top surface of the second battery electrode layer 28 is physically exposed, and an area in which a top surface of the second capacitor electrode layer 88 is physically exposed.

The semiconductor structure of the second exemplary structure comprises an energy harvesting device 80 and a battery structure 20 that are formed within, and over, a substrate 8. Generally, the layer stack (20, 40, 80) includes, in a forward order or in a reverse order, a first battery electrode layer 22, an energy storage medium layer 26, a second battery electrode layer 28, a diode (42, 44) layer stack including a p-n junction or a p-i-n junction therein, a first capacitor electrode layer 82, a node dielectric layer 86 selected from a ferroelectric material layer and an antiferroelectric material layer, and a second capacitor electrode layer 88.

Figure 7:
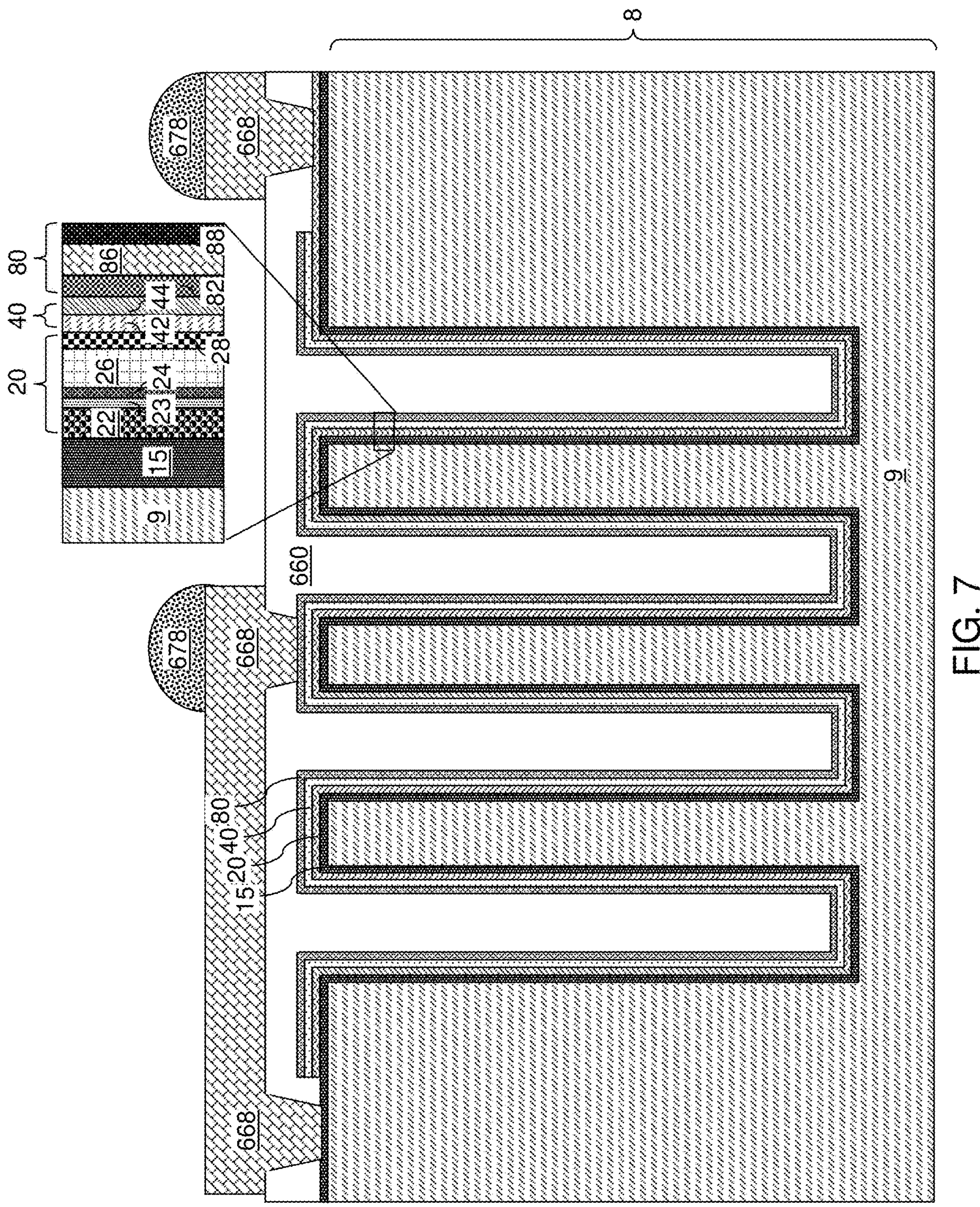
FIG. 7 is a vertical cross-sectional view of the second exemplary structure after formation of bonding structures according to an embodiment of the present disclosure.

Referring to FIG. 7, a dielectric material layer may be subsequently formed over the layer stack (20, 40, 80). For example, a bonding-level dielectric material layer 660 (such as a passivation dielectric layer including silicon nitride or polyimide) may be formed in any unfilled volume of the at least one trench 5 and over the horizontally-extending portion of the layer stack (20, 40, 80). Openings may be formed through the bonding-level dielectric material layer 660. Bonding structures 668 such as underbump metallization (UBM) lines may be formed in the openings on a respective one of the second capacitor electrode layer 88, the second battery electrode layer 28, and the first battery electrode layer 22 or the liner layer 15 (in embodiments in which the liner layer comprises a conductive material). The bonding structures 668 may extend through the bonding-level dielectric material layer 660. In some embodiments, the bonding structures 668 may comprise multiple via portions that may be used to provide electrical connection between the first battery electrode layer 22 and the second capacitor electrode layer 88. The bonding structures 668 may be electrically connected to a respective element selected from the first capacitor electrode layer 82 and the second battery electrode layer 28. A solder material portion 678 may be subsequently attached to each bonding structure 668 so that the semiconductor die may be bonded to another structure (such as an interposer).

In the second exemplary structure, at least one trench 5 vertically extends from a top surface of the substrate 8 toward a backside of the substrate 8. The layer stack (20, 40, 80) comprises a vertically-extending portion that is located inside the at least one trench 5. A dielectric material layer (such as the bonding-level dielectric material layer 660) may overlie the layer stack (20, 40, 80). The bonding structures 668 may extend through the dielectric material layer, and may be electrically connected to a respective element selected from the second capacitor electrode layer 88 and the second battery electrode layer 28.

The first battery electrode layer 22 and the second capacitor electrode layer 88 may be electrically connected by forming at least one metal interconnect structure that provides an electrically conductive path between the first battery electrode layer 22 and the second capacitor electrode layer 88. The at least one metal interconnect structure may comprise a combination of a metal strip and two via portions of a bonding structure 668. A solder material portion 678 may be attached to a widened portion of the bonding structure 668. In one embodiment, a battery electrode contact via structure (comprising a via portion of another bonding structure 668) may be in contact with a top surface of the second battery electrode layer 28 of the battery structure 20.

The second exemplary structure comprises a semiconductor structure located over a substrate 8. The semiconductor structure comprises a parallel connection of a first connection component (40, 80) and a second connection component 20. The first connection component (40, 80) comprises a series connection of a diode 40 and a capacitor (which functions as an energy harvest device 80) that is selected from a metal-ferroelectric-metal capacitor and a metal-antiferroelectric-metal capacitor. The second connection component 20 comprises a battery structure 20. The battery structure 20 comprises a first battery electrode layer 22 that is electrically connected (i.e., shorted) to the second capacitor electrode layer 88, and a second battery electrode layer 28 that is electrically connected to an electrical node of the diode 40, such as the n-doped semiconductor material layer 42.

Figure 8:
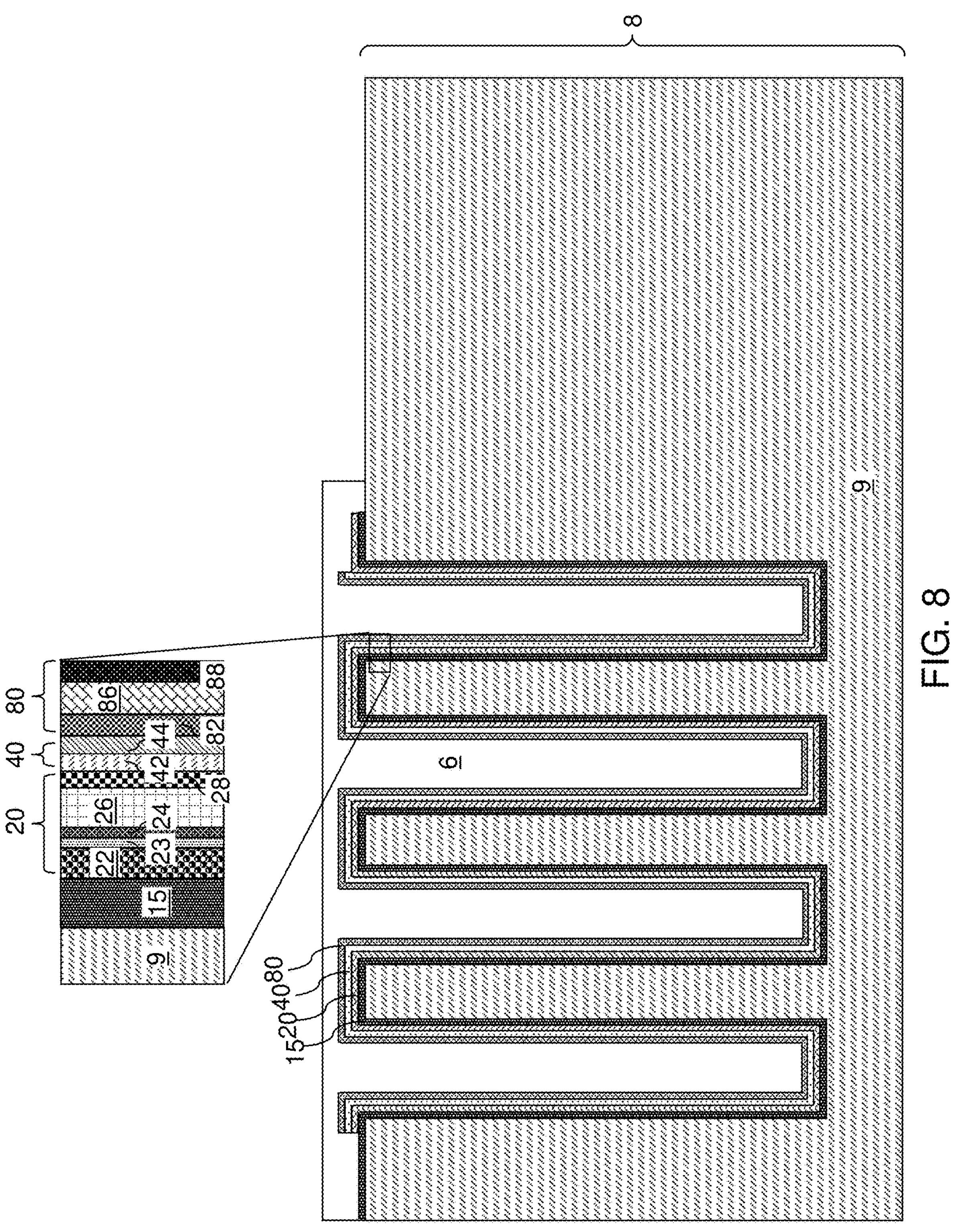
FIG. 8 is a vertical cross-sectional view of a third exemplary structure after formation of a layer stack including an energy harvesting device and a battery structure according to an embodiment of the present disclosure.

Referring to FIG. 8, a third exemplary structure according to an embodiment of the present disclosure may be derived from the second exemplary structure illustrated in FIG. 6 by depositing a trench-fill dielectric material layer 6 over the area of the layer stack (20, 40, 80). The trench-fill dielectric material layer 6 comprises a dielectric fill material such as silicon oxide. In one embodiment, the trench-fill dielectric material layer 6 may be patterned to physically expose a portion of the top surface of the substrate 8 that is located outside the area of the layer stack (20, 40, 80).

Figure 9:
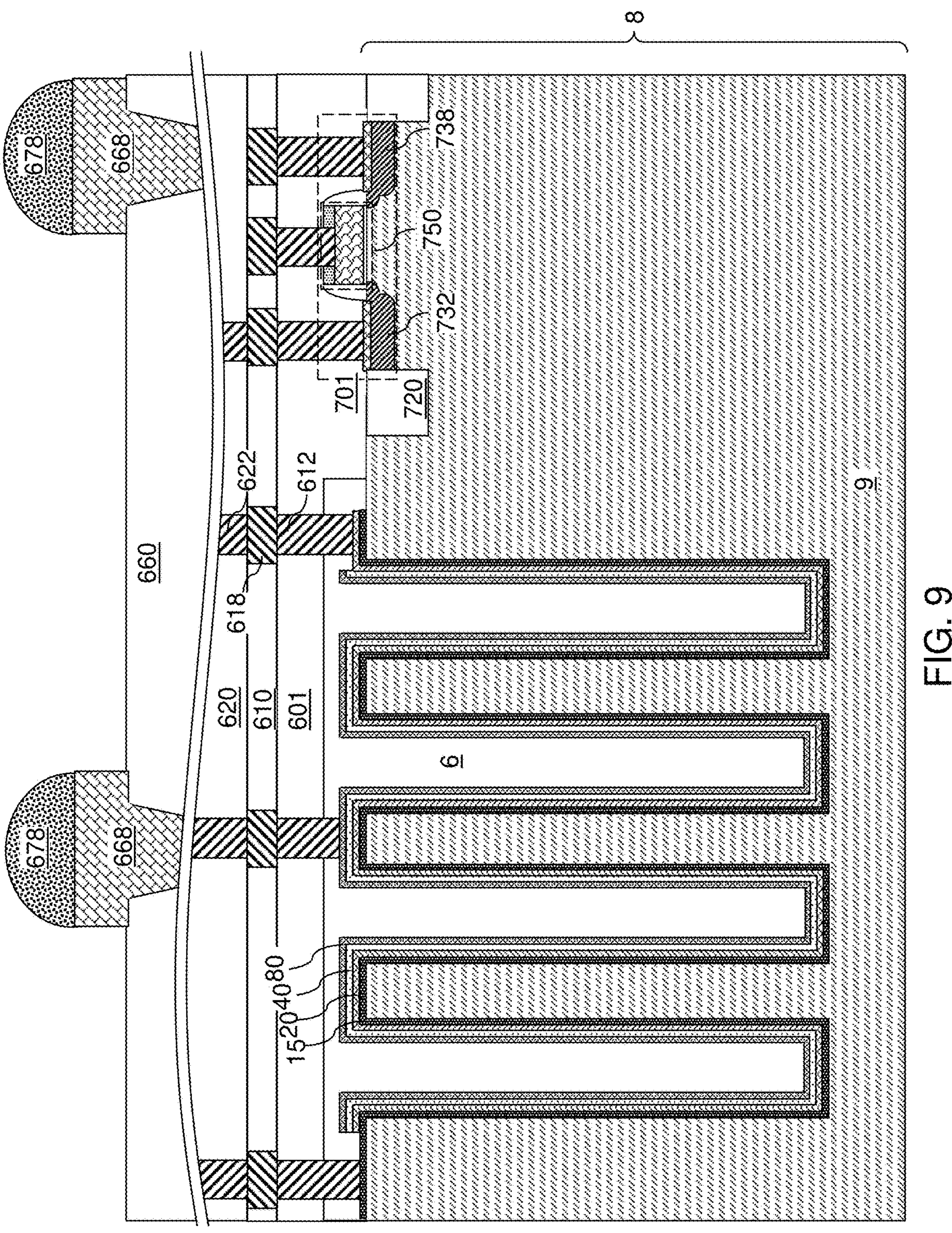
FIG. 9 is a vertical cross-sectional view of the third exemplary structure after formation of semiconductor devices, metal interconnect structures, and bonding structures according to an embodiment of the present disclosure.

Referring to FIG. 9, the processing steps described with reference to FIG. 1 may be performed to form various semiconductor devices such as field effect transistors 701 over a portion of the substrate 8 located outside the area of the layer stack (20, 40, 80). The various metal interconnect structures (612, 618, 622, 628, 632, 638, 642, 648, 652, 658) and the various dielectric material layers (601, 610, 620, 630, 640, 650) described with reference to FIGS. 1 and 4A-4C may be performed. Optionally, the processing steps for formation and patterning of the layer stack (20, 40, 80) in the first exemplary structure (as described with reference to FIGS. 1, 2A and 2B, and 3A and 3B) may be omitted. A bonding-level dielectric material layer 660, bonding structures 668, and solder material portions 678 may be formed by performing the processing steps described with reference to FIGS. 4A-4C.

According to an aspect of the present disclosure, the metal interconnect structures (612, 618, 622, 628, 632, 638, 642, 648, 652, 658) in the third exemplary structure may be configured to provide an electrically conductive path between the first battery electrode layer 22 and the second capacitor electrode layer 88. A subset of the metal interconnect structures (612, 618, 622, 628, 632, 638, 642, 648, 652, 658) may provide an electrically conductive path between the first battery electrode layer 22 and the second capacitor electrode layer 88. A battery electrode contact via structure, comprising one of the device contact via structures 612, may contact a top surface of a battery electrode 28 of the battery structure 20.

Generally, the layer stack (20, 40, 80) in the third exemplary structure (or in alternative configurations thereof) may include, from one side to another, a first battery electrode layer 22, an energy storage medium layer 26, a second battery electrode layer 28, a diode layer stack (42, 44) including a p-n junction or a p-i-n junction therein, a first capacitor electrode layer 82, a node dielectric layer 86 selected from a ferroelectric material layer and an antiferroelectric material layer, and a second capacitor electrode layer 88.

The semiconductor structure of the third exemplary structure may be located within, and over, a substrate 8, and may comprise a parallel connection of a first connection component (40, 80) and a second connection component 20. The first connection component (40, 80) comprises a series connection of a diode 40 and a capacitor (which functions as an energy harvest device 80) that is selected from a metal-ferroelectric-metal capacitor and a metal-antiferroelectric-metal capacitor. The second connection component 20 comprises a battery structure 20.

In one embodiment, the semiconductor structure comprises at least one metal interconnect structure (612, 618, 622, 628, 632, 638, 642, 648) that provides an electrically conductive path between an electrode of the capacitor (which functions as an energy harvest device 80) and an electrode of the battery structure 20. In one embodiment, the battery structure 20 comprises a first battery electrode layer 22 that is electrically connected to the second capacitor electrode layer 88, and a second battery electrode layer 28 that is electrically connected to an electrical node of the diode 40, such as the n-doped semiconductor material layer 42.

In one embodiment, the at least one metal interconnect structure (612, 618, 622, 628, 632, 638, 642, 648, 652, 658) comprises at least one metal line structure (618, 628, 638, 648, 658) and at least one metal via structure (612, 622, 632, 642, 652) that are located within at least one dielectric material layer (601, 610, 620, 630, 640, 650). The layer stack (30, 40, 80) underlies the metal interconnect structures (612, 618, 622, 618, 632, 638, 642, 648, 652, 658) and the dielectric material layers (601, 610, 620, 630, 640, 650).

In one embodiment, the substrate 8 comprises a semiconductor substrate, and the semiconductor structure comprises field effect transistors 701 located on, or over, the semiconductor substrate. The layer stack (20, 40, 80) may be located within, and over, the semiconductor substrate. The metal interconnect structures (612, 618, 622, 618, 632, 638, 642, 648) may comprise a first subset of the metal interconnect structures (612, 618, 622, 618, 632, 638, 642, 648) that is electrically connected to the second capacitor electrode layer 88, and a second subset of the metal interconnect structures (612, 618, 622, 618, 632, 638, 642, 648) that is electrically connected to the second battery electrode layer 22.

Figure 10A:
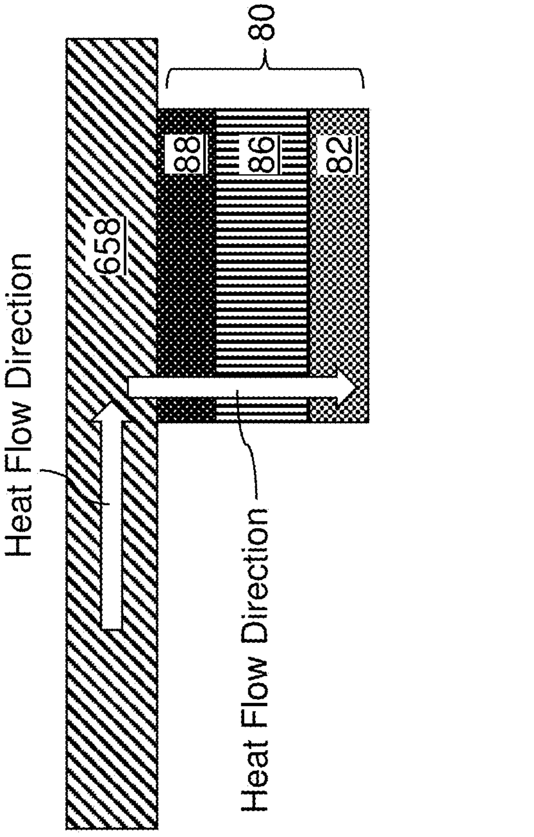
FIG. 10A is a schematic illustration of an energy harvesting device under a heat flow condition during operation of a device of the present disclosure.

FIG. 10A is a schematic illustration of an energy harvesting device 80 of the present disclosure under a heat flow condition during operation. Exemplary heat flow directions are illustrated for an operational configuration selected from many possible operational configurations. Generally, the heat flow direction may be from the second capacitor electrode layer 88 to the first capacitor electrode layer 82 with an accompanying temperature gradient, or from the first capacitor electrode layer 82 to the second capacitor electrode layer 88 with an accompanying temperature gradient. Further, the temperature within the node dielectric layer 86 may increase over time or decrease over time.

Figures 10B, 10C:
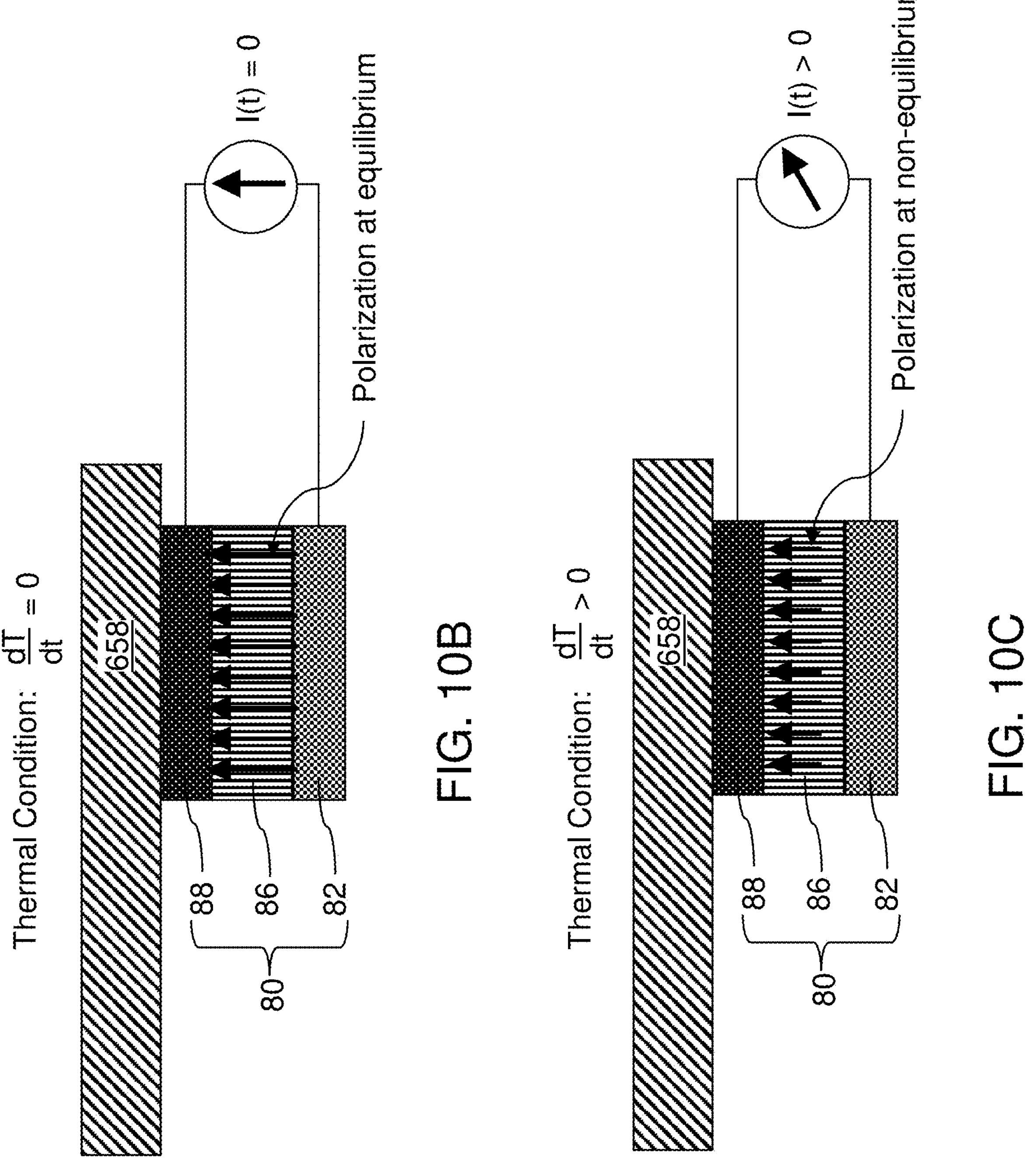
FIG. 10B is a schematic illustration of the energy harvesting device when the temperature of the energy harvesting device is static.
FIG. 10C is a schematic illustration of the energy harvesting device when the temperature of the energy harvesting device increases over time.

Referring to FIG. 10B, electrical conditions within the energy harvesting device 80 of the present disclosure are illustrated when the temperature distribution within the ferroelectric material or the antiferroelectric material in the node dielectric layer 86 is static over time. In other words, each point within the node dielectric layer 86 is under the condition of dT/dt=0 in which T represents a local temperature and t represents time. The electrical polarization of the ferroelectric material layer or the antiferroelectric material layer is generally temperature dependent. Since the temperature does not change over time, the electrical polarization of the ferroelectric material layer or the antiferroelectric material layer does not change over time. Thus, there is no change in the net charge at the side of the first capacitor electrode layer 82 or at the side of the second capacitor electrode layer 88. The energy harvesting device 80 is in electrical equilibrium, and the electromotive force across the first capacitor electrode layer 82 and the second capacitor electrode layer 88 is zero. In other words, the energy harvesting device 80 does not generate any pyroelectric voltage when the temperature distribution within the node dielectric layer 86 is static over time.

Referring to FIG. 10C, electrical conditions within the energy harvesting device 80 of the present disclosure are illustrated when the temperature distribution within the ferroelectric material or the antiferroelectric material in the node dielectric layer 86 is non-static over time. In the illustrated example, at least some points (which may be all points in some embodiments) within the node dielectric layer 86 is under the condition of dT/dt≠0 in which T represents a local temperature and t represents time. For example, the node dielectric layer 86 in the energy harvesting device 80 may be under the condition of dT/dt>0. Since the electrical polarization of the ferroelectric material layer or the antiferroelectric material layer is temperature dependent, the change of temperature over time incudes a change the electrical polarization of the ferroelectric material layer or the antiferroelectric material layer. The change in the electrical polarization of the ferroelectric material or the antiferroelectric material in the node dielectric layer 86 causes accumulation of net charges of a first conductivity type in the first capacitor electrode layer 82, and causes accumulation of net charges of a second conductivity type (which is the opposite of the first conductivity type) in the second capacitor electrode layer 86. The energy harvesting device 80 is in electrical non-equilibrium, and the electromotive force across the first capacitor electrode layer 82 and the second capacitor electrode layer 88 is non-zero. In other words, the energy harvesting device 80 generates a pyroelectric voltage when the temperature distribution within the node dielectric layer 86 is static over time.

Generally, the magnitude of the electrical polarization within the ferroelectric material or the antiferroelectric material may increase or decrease over time depending on the sign of the time derivative of temperature. Temperature dependence of the electrical polarization as a function of temperature may be a complex function that depends on an individual ferroelectric or antiferroelectric material. As long as the ferroelectric or antiferroelectric material is operated in a temperature range in which the temperature derivative of electrical polarization (dP/dT) is non-zero, the energy harvesting device 80 of the present disclosure may generate pyroelectric voltage.

The energy harvesting device 80 of the present disclosure generates a pyroelectric voltage that is proportional to the time derivative of temperature (dT/dt) in a ferroelectric or antiferroelectric material having a non-zero temperature derivative of electrical polarization (dP/dT). The current generated by the pyroelectric voltage may be a polarization current or a depolarization current depending on the operational conditions. Generally, the polarity of the pyroelectric voltage depends on the direction of electrical polarization in the ferroelectric material or in the antiferroelectric material as provided prior to operation of the energy harvesting device 80. The electrical polarization in the ferroelectric or antiferroelectric material in node dielectric layer 86 may be upward or downward depending on the initialization bias voltage that aligns the polarization direction of the ferroelectric or antiferroelectric material prior to operation of the energy harvesting device 80. Flipping the electrical polarization may cause a change in the polarity of the pyroelectric voltage.

Further, the polarity of the pyroelectric voltage depends on the sign of the time derivative of temperature. Thus, a condition in which the temperature of the ferroelectric or antiferroelectric material of the node dielectric layer 86 decreases over time generates a pyroelectric voltage of an opposite sign than a condition in which the temperature of the ferroelectric or antiferroelectric material of the node dielectric layer 86 increases over time.

Figure 11:
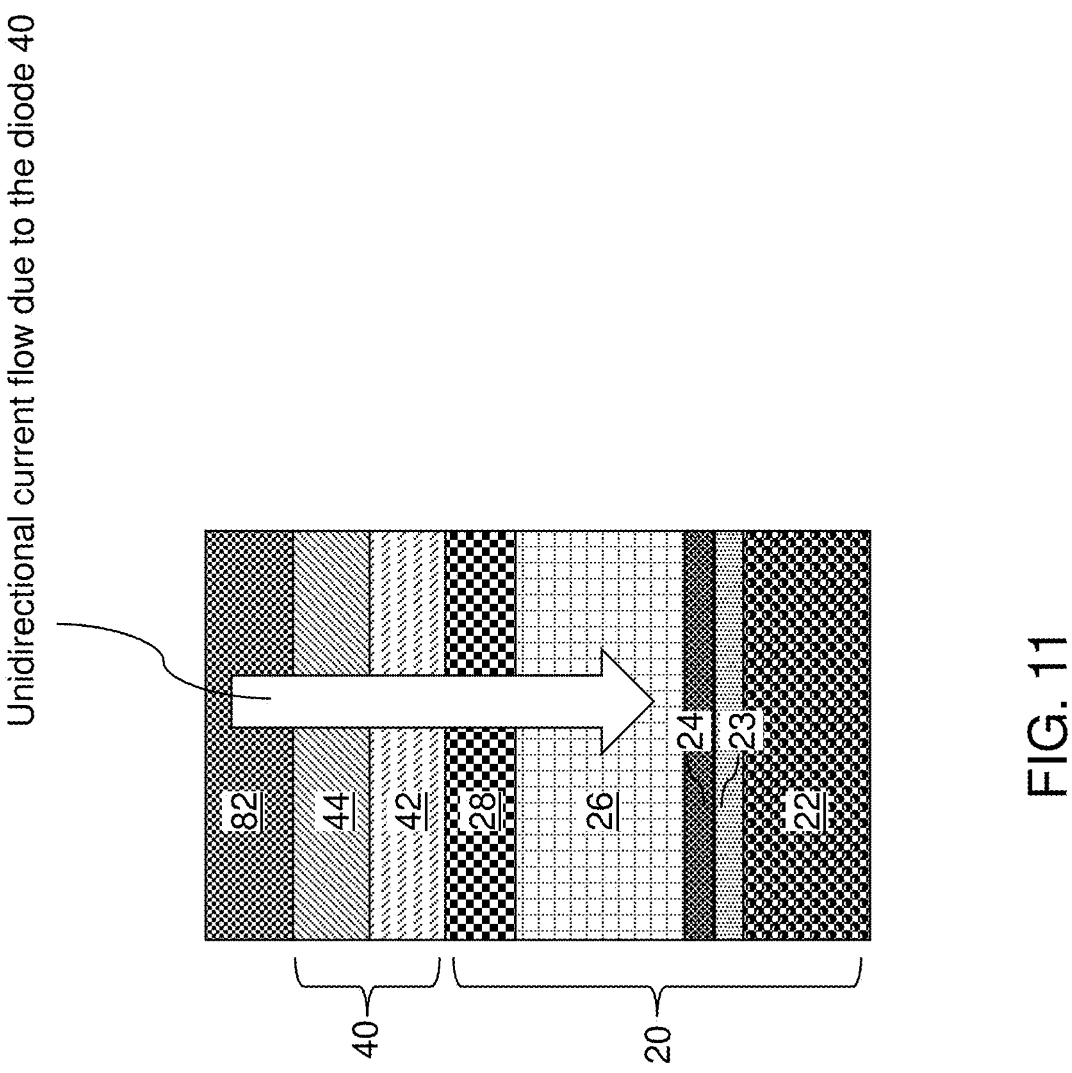
FIG. 11 is a schematic diagram of the combination of a diode and a battery structure during operation of the heat harvesting device of the present disclosure.

Referring to FIG. 11, a current rectification scheme according to an embodiment of the present disclosure is illustrated. While the energy harvesting device 80 in various embodiments generates pyroelectric voltages of opposite types depending on the operational condition, use of voltage having random polarity that varies over time is difficult. The diode 40 in various embodiments provides rectification for the pyroelectric voltages such that the pyroelectric voltage of a selected polarity may be transmitted to the battery structure 20, while the pyroelectric voltage of the unselected polarity may be blocked. Generally, the diode 40 may be positioned in either direction. Selection of the polarity of the diode 40 selects the polarity of the pyroelectric voltage to be utilized, i.e., to be stored in the battery structure 20. In the illustrated configuration in which the p-doped semiconductor material layer 42 overlies the n-doped semiconductor material layer 44, positive charge carriers (such as holes) may flow down through the diode 40 and/or negative charge carriers (such as electrons) may flow up through the diode 40. In embodiments in which the diode 40 is installed with the opposite polarity, the electrical current may flow in the opposite direction.

Referring to FIG. 12A, a circuit diagram during preconditioning of the semiconductor device of the present disclosure is illustrated according to an embodiment of the present disclosure. A power source 30 configured to provide a direct current (DC) bias voltage may be attached across the second capacitor electrode layer 88 (labeled as a top electrode TE) of the energy harvesting device 80 and the second battery electrode layer 28 of the battery structure 20. The first capacitor electrode layer 82 (labeled as a bottom electrode BE) is electrically connected to a node of the diode 40. The power source 30 may comprise a capacitor that is charged using a power supply circuit located in a semiconductor die. Alternatively, the power source 30 may be an external power source that is provided, for example, on a tester during chip testing, and is used to initialize the ferroelectric or antiferroelectric material in the node dielectric layer 86. A switch, which is herein referred to as a polarization initialization switch 50, may be provided within a semiconductor die or on a tester (i.e., outside the semiconductor die containing the energy harvesting device 80). In instances in which the polarization initialization switch 50 is closed, a DC bias voltage that is sufficient to align the polarization direction of the ferroelectric or antiferroelectric material in the node dielectric layer 86 is applied across the energy harvesting device 80. The polarity of the DC bias voltage may be selected such that the diode 40 does not block the applied DC bias voltage, but consumes only a diode turn-on voltage. Generally, the polarization initialization switch 50 is configured to apply a DC bias voltage across the first connection component (40, 80) of the parallel connection of the first connection component (40, 80) (i.e., a series connection of the diode 40 and the energy harvesting device 80) and the second connection component 20 (i.e., the battery structure 20). The second connection component 20 may be collaterally applied with the DC bias voltage during the polarization initialization process. The DC bias voltage has a magnitude that induces alignment of electrical polarization in a ferroelectric material or in an antiferroelectric material in the energy harvest device 80, which is a ferroelectric capacitor or an antiferroelectric capacitor. Various embodiment devices disclosed herein may provide electrically bipolar field cycling and energy storage at selected remanent polarization direction.

Figure 12B:
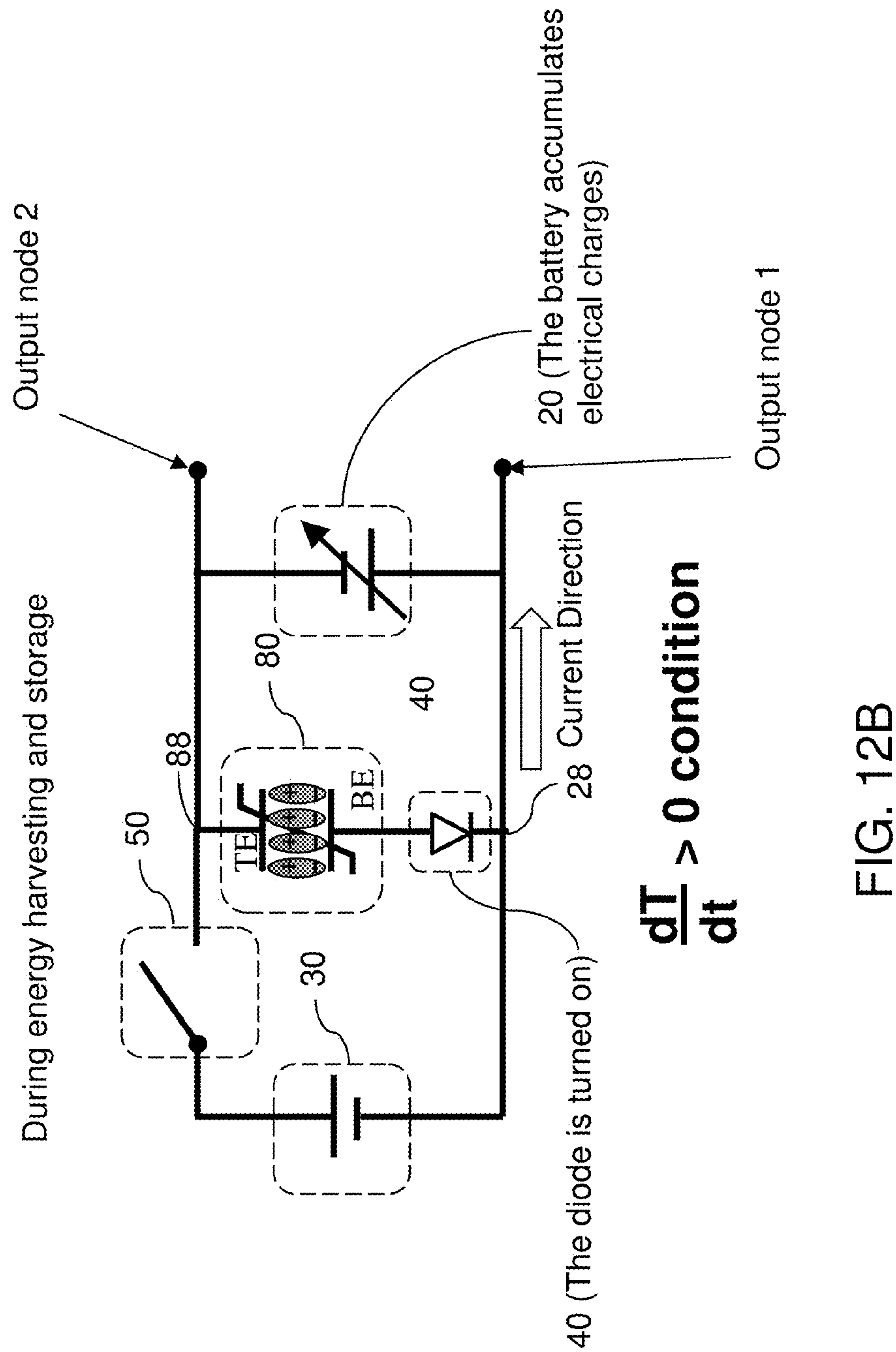
FIG. 12B is a circuit diagram during capture of energy by the energy harvesting device according to an embodiment of the present disclosure.

Referring to FIG. 12B, various embodiment devices may be illustrated during energy harvesting, i.e., during capture of thermal energy by the energy harvesting device. In the illustrated example, the energy harvesting device 80 and the diode 40 may be configured to capture energy when the time derivative of temperature within the ferroelectric or antiferroelectric material in the node dielectric layer 86 is positive. As discussed above, the polarity of the polarization in the ferroelectric or antiferroelectric material and/or the polarity of the diode 40 may be selected such that the combination of the energy harvesting device 80 and the diode 40 captures thermal energy and generates pyroelectric voltage either when the time derivative of temperature is positive or when the time derivative of temperature is negative. The electrical current generated by the pyroelectric voltage may flow through the diode 40, and may power a load (not illustrated) connected to the two output nodes and/or may flow into the battery structure 20 to charge the battery structure 20.

Figure 12C:
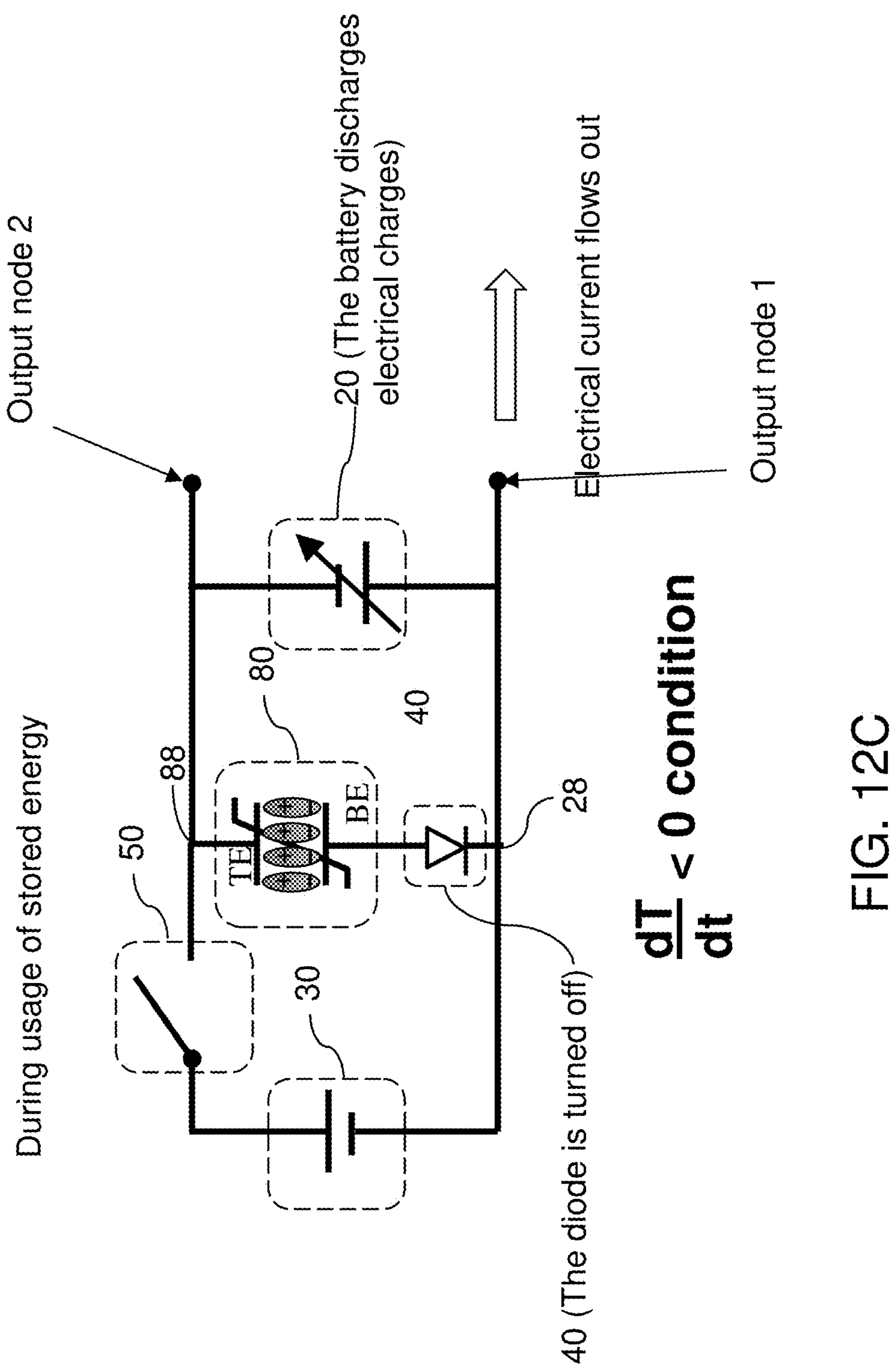
FIG. 12C is a circuit diagram during energy discharge from the battery structure according to an embodiment of the present disclosure.

Referring to FIG. 12C, various embodiment devices may be illustrated while the energy harvesting device 80 is not harvesting energy, i.e., when the time derivative of temperature within the node dielectric layer 86 is the opposite of the condition that provides energy harvesting. In the illustrated example, the time derivative of temperature in the node dielectric layer 86 is negative, and the diode 40 blocks current flow through the series connection of the energy harvesting device 80 and the diode 40. Discharge of the electrical energy stored in the battery structure 20 through the series connection of the energy harvester 80 and the diode 40 is prevented because the diode 40 is turned off for the purpose of current discharge from the battery structure 20. The energy in the battery structure 20 may be utilized by discharge through the two output nodes. In some embodiments, power switches (not shown) may be connected to one of the output nodes to regulate usage of the electrical energy provided by the energy harvesting and storage circuit illustrated in FIGS. 12A-12C.

Figure 13:
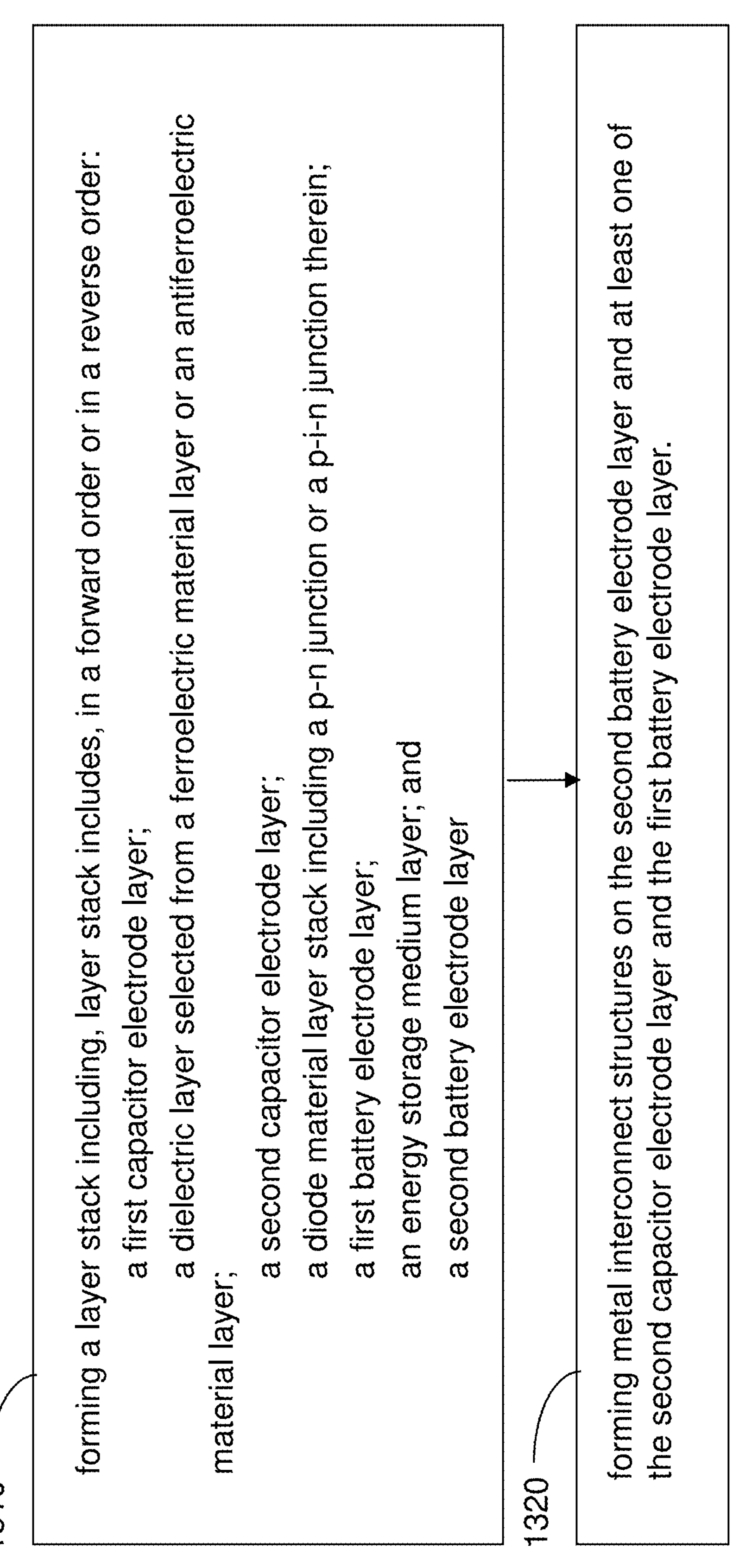
FIG. 13 is a flowchart that illustrates the general processing steps for manufacturing the semiconductor devices of the present disclosure according to an embodiment of the present disclosure.

Referring to FIG. 13, a flowchart illustrates the general processing steps for manufacturing a semiconductor structure comprising an energy harvesting device and a battery structure 20 within, or over, a substrate 8.

Referring to step 1310 and FIGS. 1-3B, 5, 6, and 8, by forming a layer stack on a substrate 8, wherein the layer stack includes, in a forward order or in a reverse order: a first battery electrode layer 22; an energy storage medium layer 26; a second battery electrode layer 28; a diode layer stack 40 including a p-n junction or a p-i-n junction therein; a first capacitor electrode layer 82; a node dielectric layer 86 selected from a ferroelectric material layer and an antiferroelectric material layer; and a second capacitor electrode layer 88.

Referring to step 1320 and FIGS. 4A-4C, 7, and 9, metal interconnect structures {(652, 658), 668, or (612, 618, 622, 628, 632, 638, 642, 648, 652, 658)} may be formed on the second battery electrode layer 28 and at least one of the second capacitor electrode layer 88 and the first battery electrode layer 22.

Referring to all drawings and according to various embodiments of the present disclosure, a semiconductor structure located over a substrate 8 is provided. The semiconductor structure comprises a parallel connection of a first connection component (40, 80) and a second connection component 20, wherein: the first connection component (40, 80) comprises a series connection of a diode 40 and a capacitor (which functions as an energy harvest device 80) that is selected from a metal-ferroelectric-metal capacitor and a metal-antiferroelectric-metal capacitor; and the second connection component 20 comprises a battery structure 20.

According to another aspect of the present disclosure, a semiconductor structure is provided, which comprises a layer stack that includes, from one side to another: a first battery electrode layer 22; an energy storage medium layer 26; a second battery electrode layer 28, a diode layer stack 40 including a p-n junction or a p-i-n junction therein; a first capacitor electrode layer 82; a node dielectric layer 86 selected from a ferroelectric material layer and an antiferroelectric material layer; and a second capacitor electrode layer 88.

High-performance semiconductor dies generate heat during operation. Heat generated during device operation in such high-performance semiconductor dies is typically dissipated using system level ventilation. For example, a fan may be attached to a central processing unit and/or the room housing the semiconductor devices may be air conditioned. Generally, the heat generated from prior art semiconductor devices is wasted.

Various embodiment devices are disclosed for capturing a fraction of the heat energy generated from semiconductor device operation, and for storing such captured energy in a battery structure 20. Various embodiment devices may provide a two-terminal device to harvest and store energy. The two-terminal device of the present disclosure may be embedded in a semiconductor die. The energy harvested and stored may be utilized for low power applications on the same chip. Examples of such low power applications may include a refresh operation for a ferroelectric random access memory (FeRAM) device, activation of cooling devices, etc. Various embodiment devices may provide energy recycling, and is compatible with complementary metal-oxide-semiconductor (CMOS) device fabrication methods.

Generally, various embodiment devices may allow for the harvesting of heat energy from semiconductor devices during operation of high performance CMOS IC devices, and further allows storage of the captured energy in the form of electrical energy in an energy storage medium layer 26. Various embodiment devices may be integrated into CMOS IC devices using three-dimensional integrated circuit fabrication processes, silicon backend processes, or far backend processes. Generally, the processing steps of various embodiment methods of making the device are compatible with semiconductor processing steps used in the microelectronics industry, and provides energy recycling and storage of the recycled energy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure comprising an energy harvesting device and a battery structure within, or over, a substrate, the method comprising forming a layer stack on a substrate, wherein the layer stack includes, in a forward order or in a reverse order:

a first battery electrode layer;

an energy storage medium layer;

a second battery electrode layer, a diode layer stack including a p-n junction or a p-i-n junction therein;

a first capacitor electrode layer;

a node dielectric layer that comprises a ferroelectric material layer or an antiferroelectric material layer; and a second capacitor electrode layer.

2. The method of claim 1, further comprising:

forming semiconductor devices on the substrate; and forming metal interconnect structures and dielectric material layers over the substrate, wherein the metal interconnect structures are electrically connected to the semiconductor devices, wherein the layer stack is formed over the dielectric material layers.

3. The method of claim 2, wherein:

a layer within the layer stack is formed as a planar material layer having a respective uniform thicknesses; and the method comprises forming additional metal interconnect structures on the second battery electrode layer and on one of the second capacitor electrode layer and the first battery electrode layer.

4. The method of claim 1, further comprising forming a trench in an upper portion of the substrate, wherein the layer stack comprises a vertically-extending portion that is formed on a sidewall of the trench.

5. The method of claim 1, further comprising electrically connecting the first battery electrode layer and the second capacitor electrode layer by forming a metal interconnect structure that provides an electrically conductive path between the first battery electrode layer and the second capacitor electrode layer.

6. A method of forming a semiconductor structure, comprising:

forming semiconductor devices on a semiconductor substrate;

forming first metal interconnect structures embedded in first dielectric material layers, wherein the first metal interconnect structures are electrically connected to the semiconductor devices;

forming a layer stack over the first dielectric material layers, wherein the layer stack includes, from bottom to top, a first battery electrode layer, an energy storage medium layer, a second battery electrode layer, a diode layer stack including a p-n junction or a p-i-n junction therein, a first capacitor electrode layer, a node dielectric layer that comprises a ferroelectric material layer or an antiferroelectric material layer, and a second capacitor electrode layer; and electrically connecting the second capacitor electrode layer to the first battery electrode layer.

7. The method of claim 6, further comprising:

reducing lateral extents of the diode layer stack, the first capacitor electrode layer, the node dielectric layer, and the second capacitor electrode layer relative to a lateral extent of the second battery electrode layer; and forming a second metal interconnect structure on a top surface segment of the second battery electrode layer.

8. The method of claim 6, further comprising:

forming second metal interconnect structures after formation of the layer stack, wherein an electrically conductive path that electrically connects the second capacitor electrode layer to the first battery electrode layer comprises a subset of the second metal interconnect structures;

forming a bonding-level dielectric material layer over the second metal interconnect structures; and forming bonding structures through the bonding-level dielectric material layer on a respective one of the second metal interconnect structures.

9. The method of claim 6, wherein:

the first battery electrode layer is formed on a top surface of one of the first metal interconnect structures; and an electrically conductive path that electrically connects the second capacitor electrode layer to the first battery electrode layer comprises a metal via structure that contacts a top surface segment of said one of the first metal interconnect structures.

10. The method of claim 1, further comprising forming a blocking dielectric layer between the first battery electrode layer and the energy storage medium layer, wherein the blocking dielectric layer comprises a dielectric metal oxide material and has a thickness in a range from 1 nm to 2 nm.

11. The method of claim 1, further comprising forming a conductive metal oxide layer between the first battery electrode layer and the energy storage medium layer, wherein the conductive metal oxide layer comprises a transition metal oxide and has a thickness in a range from 0.3 nm to 2.0 nm.

12. The method of claim 1, wherein the energy storage medium layer comprises an ionic crystal plate including an ionic crystal having ionic conductivity greater than $1.0\times10^{-5}$ S/cm in a temperature range from −40 degrees Celsius to 125 degrees Celsius, and wherein the energy storage medium layer has a thickness in a range from 30 nm to 1,000 nm.

13. The method of claim 1, wherein the diode layer stack comprises an n-doped semiconductor material layer and a p-doped semiconductor material layer, each having a thickness in a range from 10 nm to 100 nm.

14. The method of claim 1, wherein the node dielectric layer comprises:

a ferroelectric material selected from barium titanate, lead zirconate titanate, polyvinylidene fluoride, or aluminum nitride; or an antiferroelectric material selected from lead zirconate or zirconium-doped hafnium oxide, and wherein the node dielectric layer has a thickness in a range from 4 nm to 100 nm.

15. A method of forming a semiconductor structure within, or over, a substrate, the method comprising:

forming a layer stack including a combination of an energy harvesting device and a battery structure, wherein the layer stack includes, in a forward order or in a reverse order:

a first battery electrode layer;

an energy storage medium layer;

a second battery electrode layer, a diode layer stack including a p-n junction or a p-i-n junction therein;

a first capacitor electrode layer;

a node dielectric layer that comprises a ferroelectric material layer or an antiferroelectric material layer; and a second capacitor electrode layer, wherein the method further comprises electrically connecting the second capacitor electrode layer to the first battery electrode layer.

16. The method of claim 15, further comprising:

forming semiconductor devices on the substrate; and forming metal interconnect structures and dielectric material layers over the substrate, wherein the metal interconnect structures are electrically connected to the semiconductor devices, wherein the layer stack is formed over the dielectric material layers.

17. The method of claim 16, wherein:

a layer within the layer stack is formed as a planar material layer having a respective uniform thicknesses; and the method comprises forming additional metal interconnect structures on the second battery electrode layer and on one of the second capacitor electrode layer and the first battery electrode layer.

18. The method of claim 15, further comprising forming a trench in an upper portion of the substrate, wherein the layer stack comprises a vertically-extending portion that is formed on a sidewall of the trench.

19. The method of claim 15, further comprising forming a metal interconnect structure that provides an electrically conductive path between the first battery electrode layer and the second capacitor electrode layer.

20. The method of claim 15, further comprising forming a blocking dielectric layer between the first battery electrode layer and the energy storage medium layer, wherein the blocking dielectric layer comprises a dielectric metal oxide material and has a thickness in a range from 1 nm to 2 nm.

* * * * *